United States Patent [19]
Lee

[11] Patent Number: 5,363,313
[45] Date of Patent: Nov. 8, 1994

[54] MULTIPLE-LAYER CONTOUR SEARCHING METHOD AND APPARATUS FOR CIRCUIT BUILDING BLOCK PLACEMENT

[75] Inventor: Tsu-Chang Lee, San Jose, Calif.

[73] Assignee: Cadence Design Systems, Inc., San Jose, Calif.

[21] Appl. No.: 843,712

[22] Filed: Feb. 28, 1992

[51] Int. Cl.⁵ .................... G06F 15/60; G06F 15/46
[52] U.S. Cl. .................... 364/491; 364/489; 364/490
[58] Field of Search ............. 364/491, 490, 489, 488

[56] References Cited

U.S. PATENT DOCUMENTS

| | | | |
|---|---|---|---|
| 4,613,940 | 9/1986 | Shenton et al. | 364/490 |
| 4,754,408 | 6/1988 | Carpenter et al. | 364/491 |
| 4,805,113 | 2/1989 | Ishii et al. | 364/491 |
| 4,815,003 | 3/1989 | Putatunda et al. | 364/489 |
| 4,839,821 | 6/1989 | Murakata | 364/491 |
| 5,187,668 | 2/1993 | Okude et al. | 364/491 |

OTHER PUBLICATIONS

Shin, H. et al. "Two-Dimensional Compaction by 'Zone Refining'" 23rd Design Automation Conf. Paper 7.3 pp. 115–122.

Liao, Y., and Wong, C. K., "An Algorithm to Compact a VLSI Symbolic Layout with Mixed Constraints", *IEEE Transactions on Computer-Aided Design of Integrated Circuits and Systems, vol. CAD-2, No. 2, Apr. 1983, pp. 62–69.*

Wang, T., and Wong, D., "An Optimal Algorithm for Floorplan Area Optimization", 27th ACM/IEEE Design Automation Conference, Paper 10.1, pp. 180–186.

Sha, L., and Blank, T., "Atlas-A Technique for Layout Using Analytic Shapes", Center for Integrated Systems, Stanford University/IEEE, 1987, pp. 84–87.

Onodera, H., Taniguchi, Y., and Tamaru, K., "Branch-and-Bound Placement for Building Block Layout", 1990 International Workshop on Layout Synthesis.

*Primary Examiner*—Thomas G. Black
*Assistant Examiner*—Tyrone Walker
*Attorney, Agent, or Firm*—Albert C. Smith

[57] ABSTRACT

Apparatus and methods for two-dimensional compaction of object collections defines an initial set of unrefined objects and an initial compaction direction. One by one, each unrefined object is taken from the unrefined object configuration and placed within a refined configuration. Both unrefined and refined configurations possess profiles along which the selected object is placed. Pruning rules select which locations to investigate more closely, by eliminating those positions that clearly do not provide compaction improvement. Various orientations and/or shapes of an object can be tried to improve the compaction or the group of objects. Once a best location for the object is found, the object is included in the refined object set, new unrefined and refined profiles are constructed, and a new unrefined object is selected to place. Once all unrefined objects have been selected and placed, the compaction process for the chosen direction has completed. The process can continue for other compaction directions, and as many times as required, to compact the collection of objects within a certain tolerance. The cost function employed to determine best object positions can include costs of wire interconnection lengths.

21 Claims, 21 Drawing Sheets

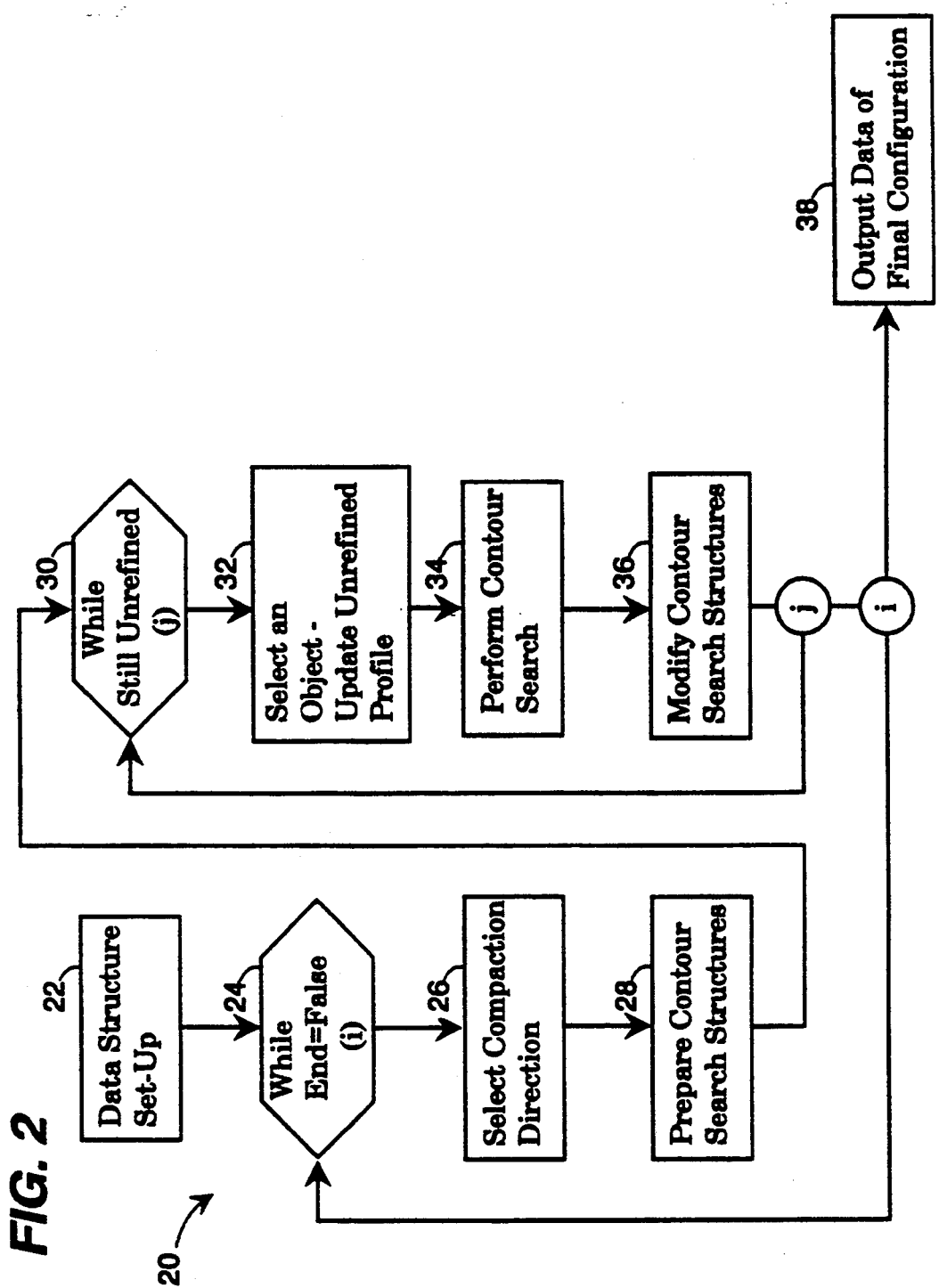

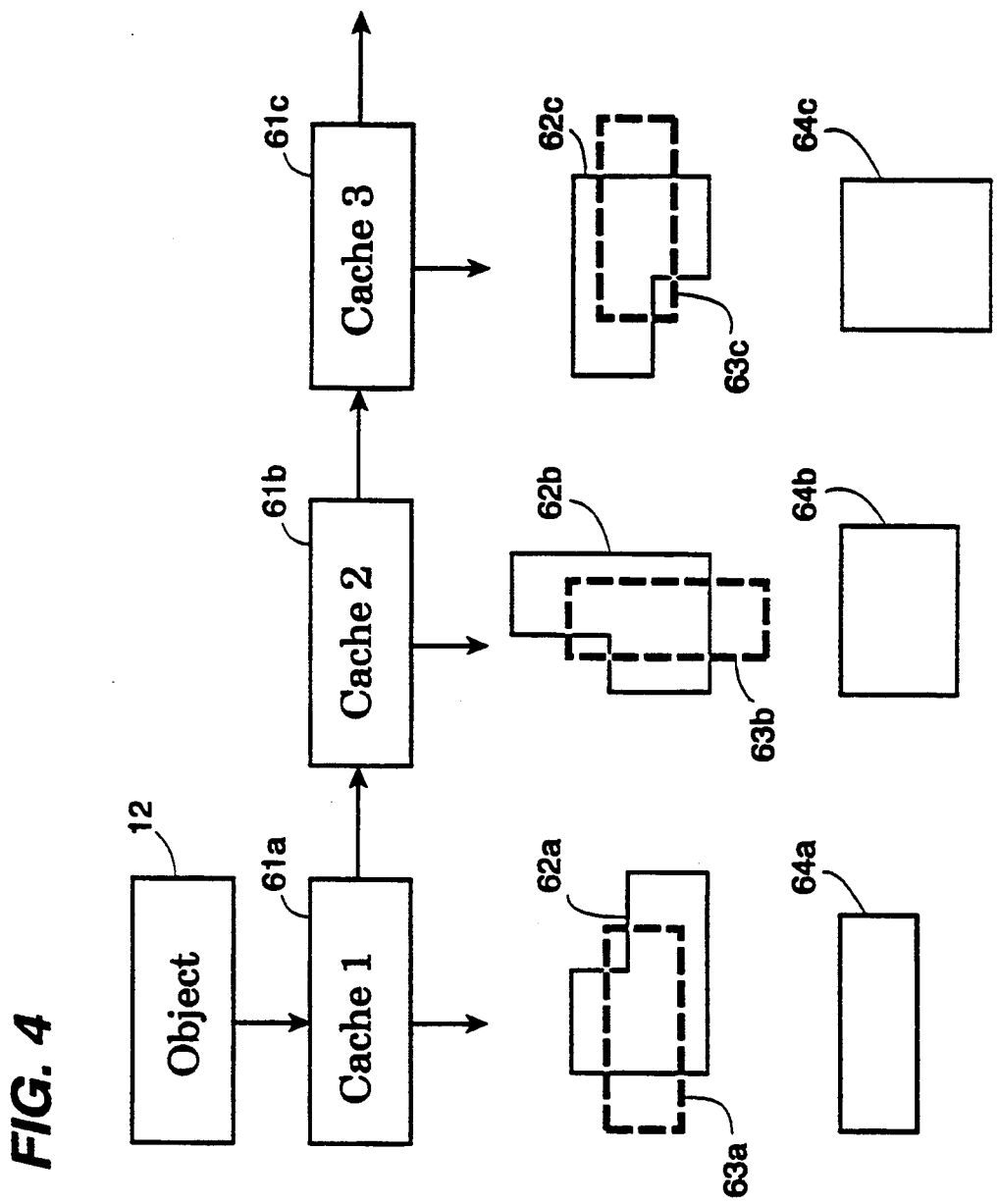

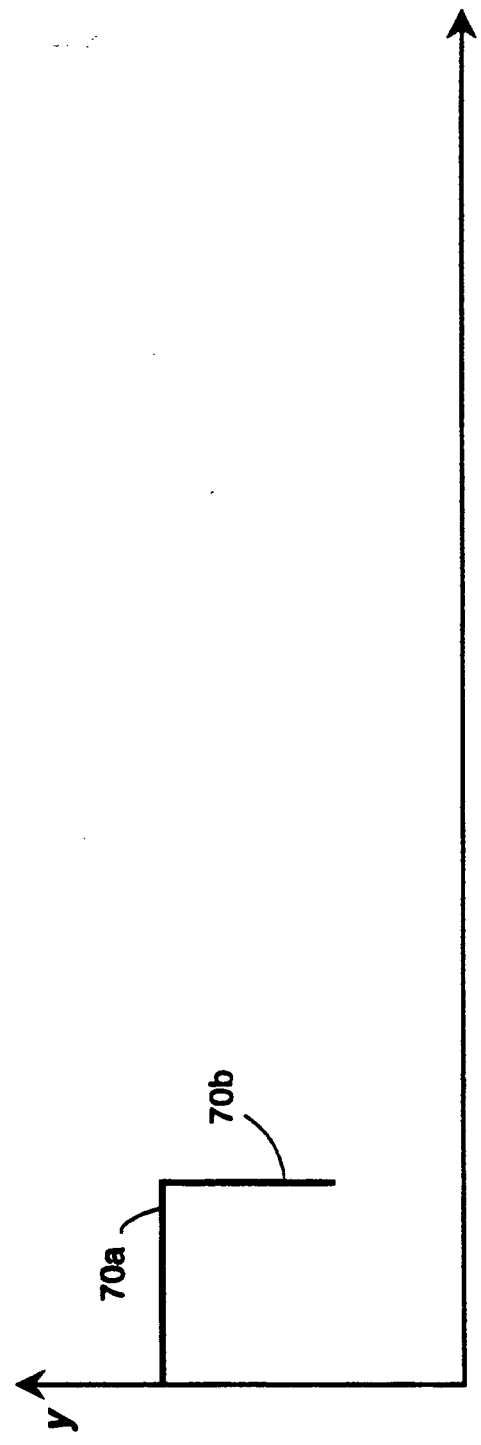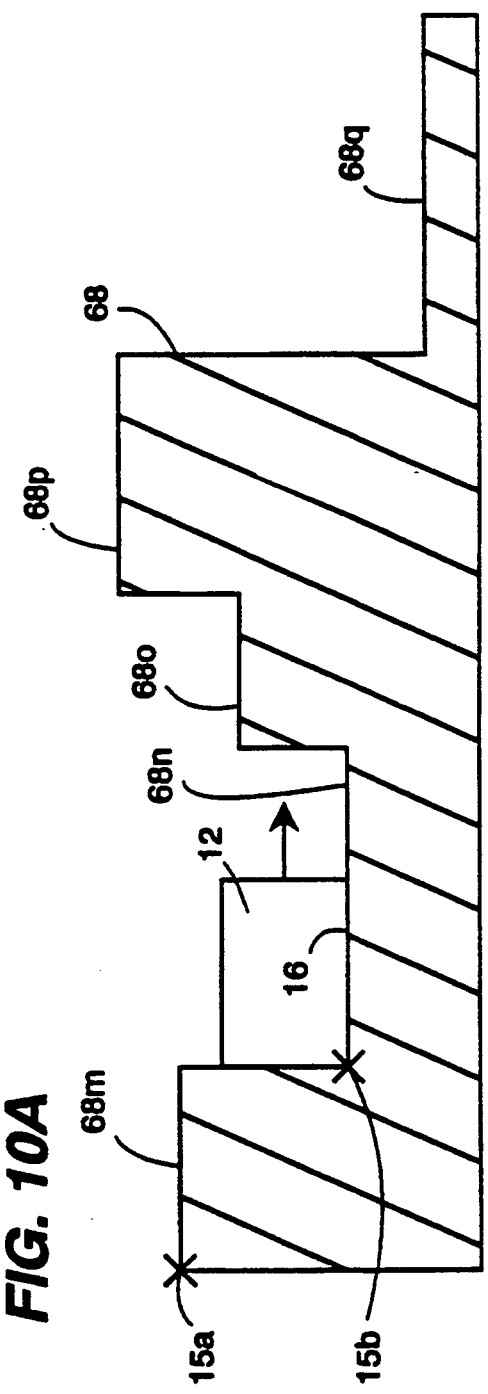

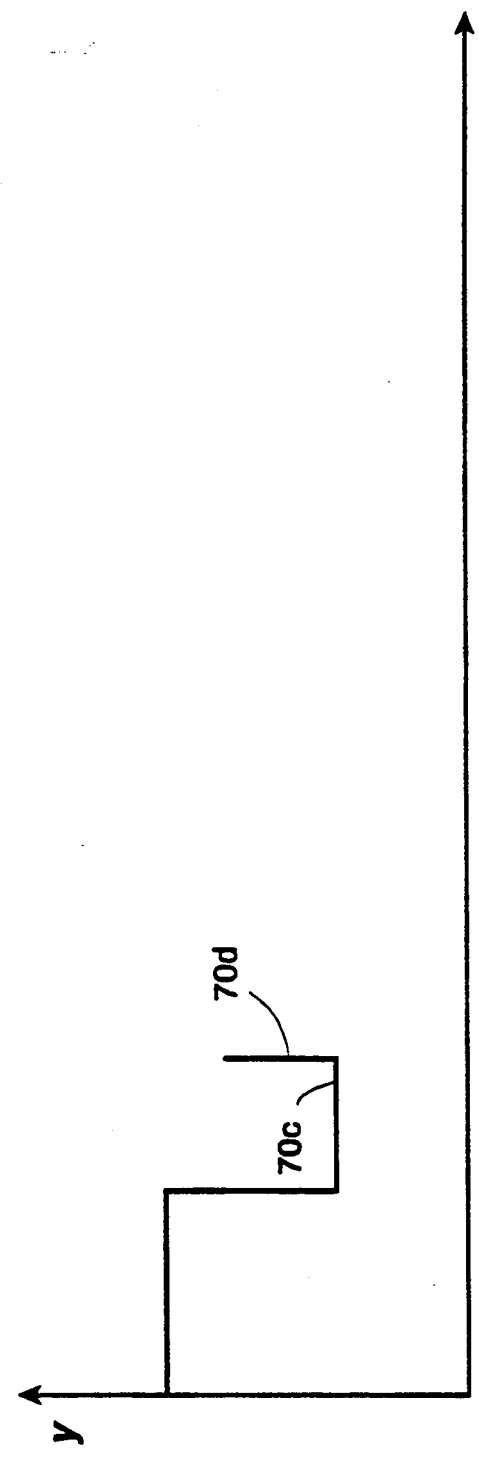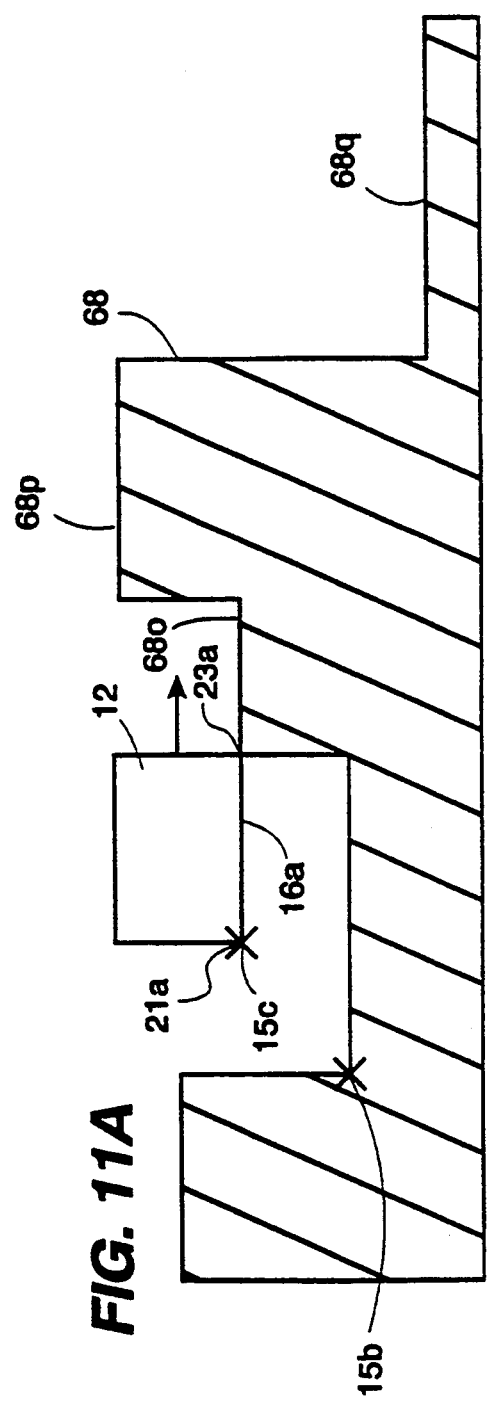

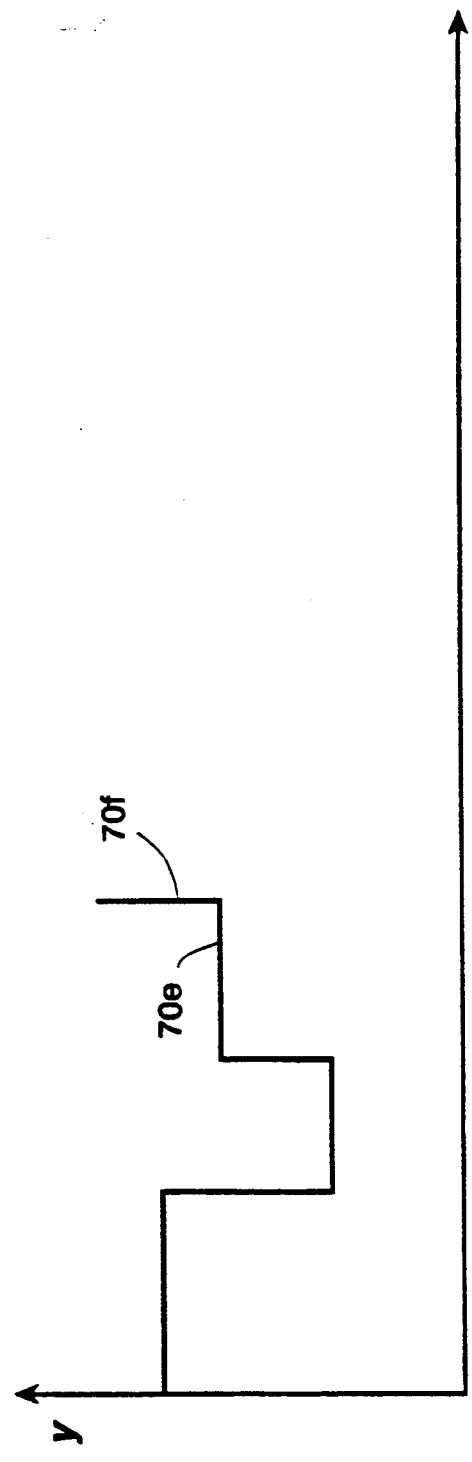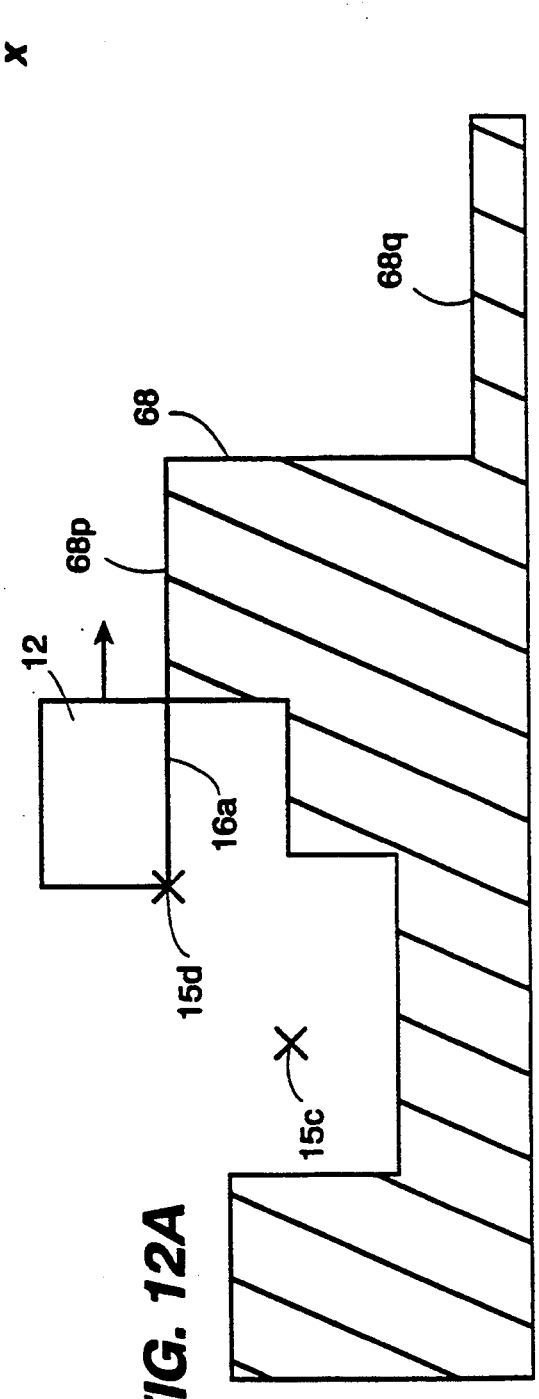
FIG. 12B
FIG. 12A

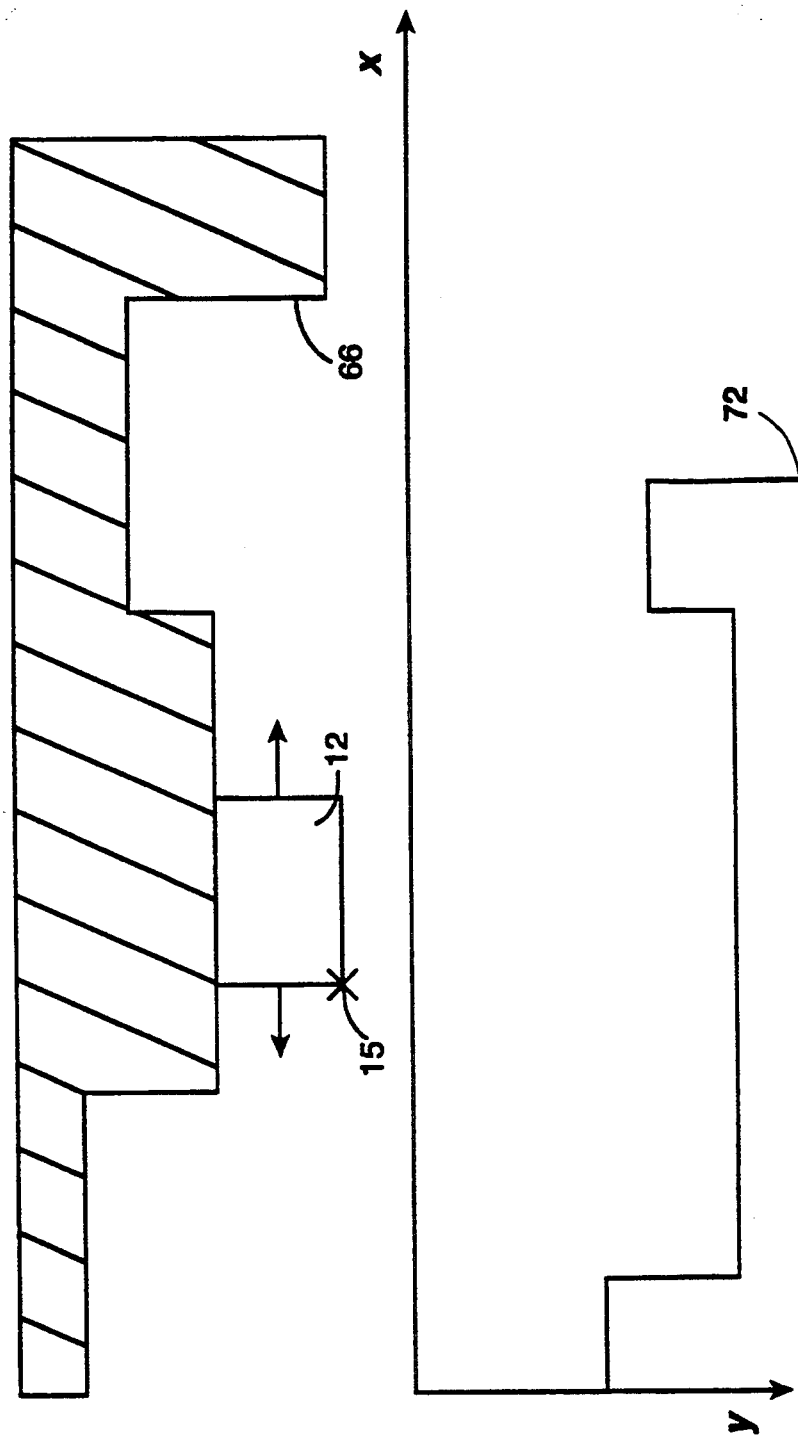

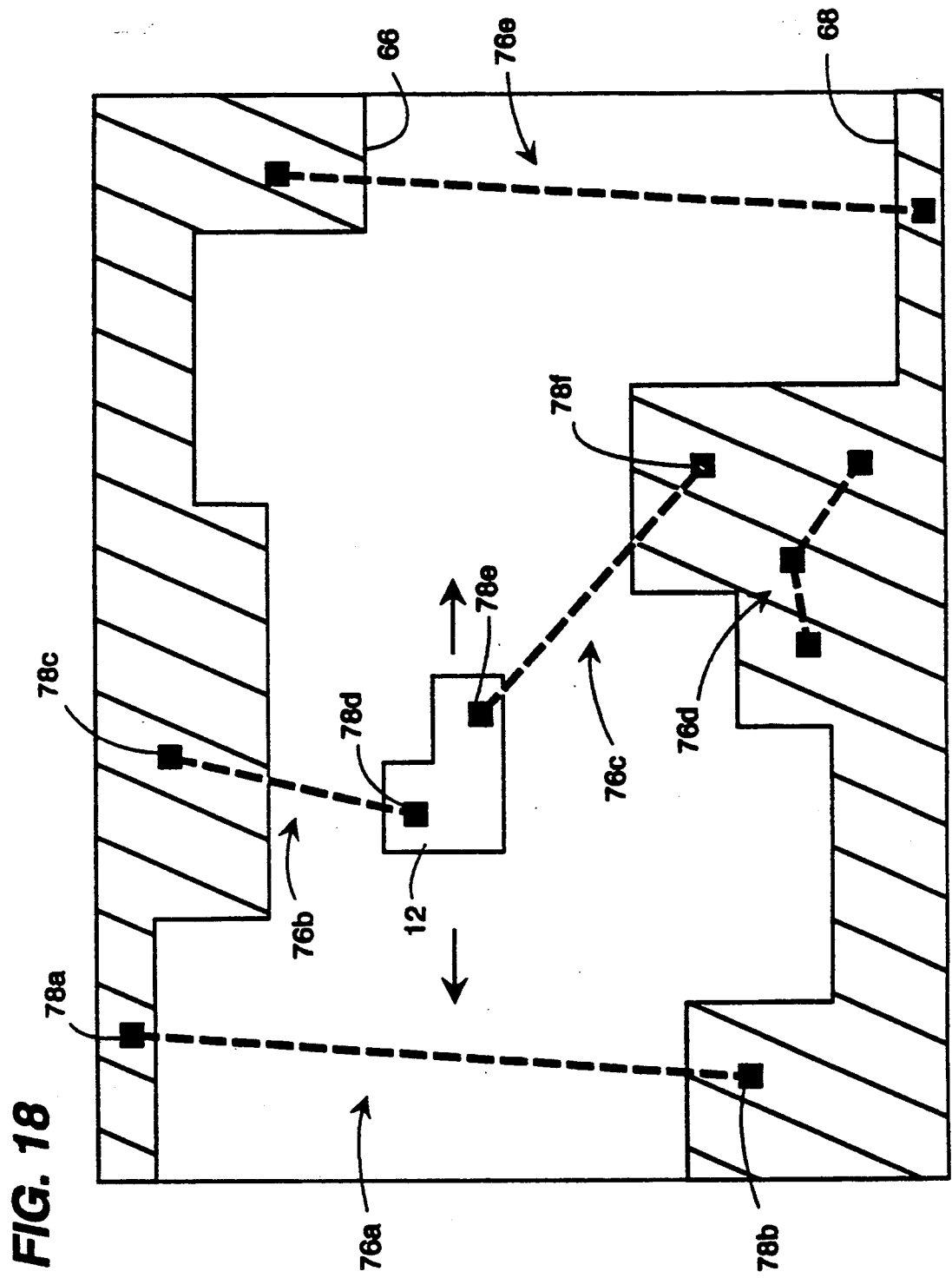

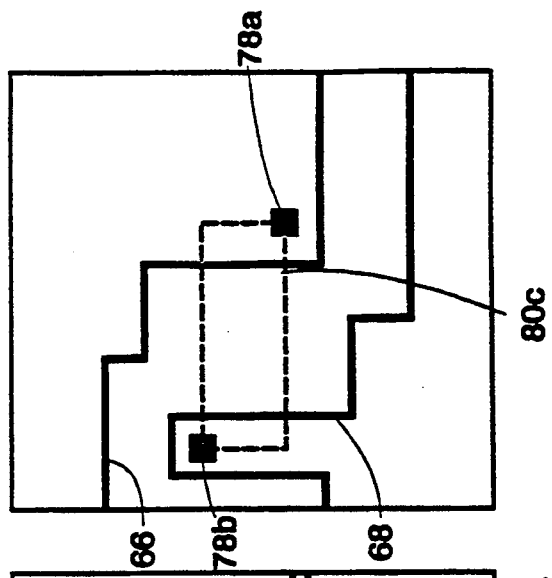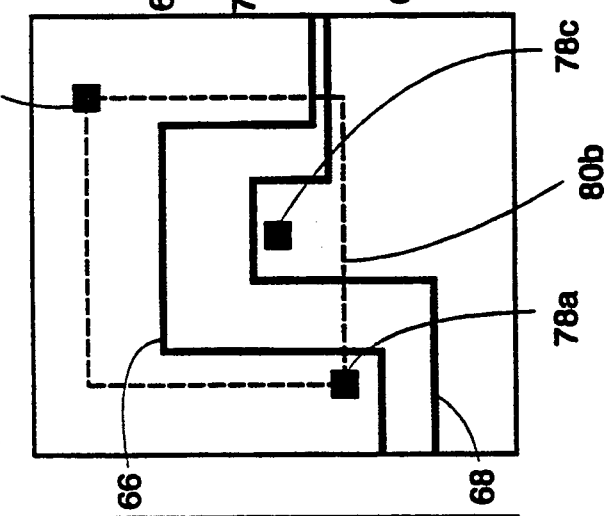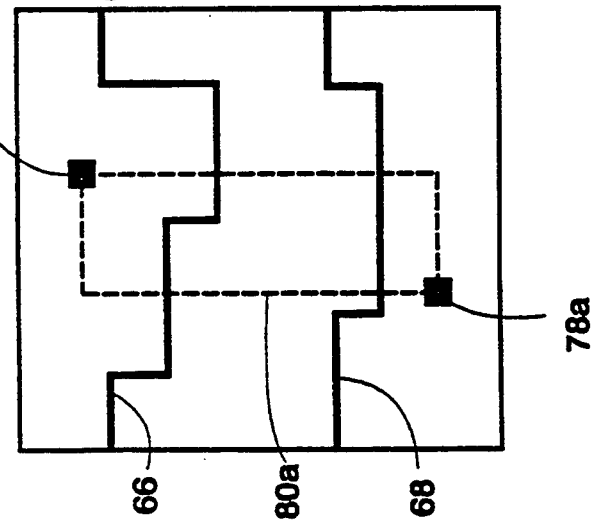

MULTIPLE-LAYER CONTOUR SEARCHING METHOD AND APPARATUS FOR CIRCUIT BUILDING BLOCK PLACEMENT

BACKGROUND OF THE INVENTION

The present invention relates to electronic CAD/CAM systems. In particular the invention relates to layout problems in computer-aided circuit design.

Use of computer-aided design and manufacturing tools and methods have dramatically increased the complexity and sophistication of electronic devices, while decreasing the amount of time and manpower required to develop these circuits. These tools have been used in the design and manufacturing of the most complicated electrical devices, such as integrated circuits, to larger multi-chip modules, to even larger printed circuit boards combining hundreds of discrete components having thousands of intricate connections. Typical integrated circuit microprocessors may have millions of transistors with millions of interconnections, all located within very small areas.

CAD/CAM design tools must solve a variety of problems in designing these complex devices. First, an electronics designer must construct the logical flow of signals into and out of the device, which the CAD/CAM system must then optimize into a series of interconnected discrete components. The discrete components are chosen to be manufacturable (in the case of integrated circuits) by a series of complementary processes onto a single semiconductor substrate. However, given strong competitive trends towards faster, smaller, energy conserving chips and other electronic devices, merely rendering the number, type and interconnections of the components alone is not satisfactory. CAD/CAM design systems must also optimize the placement of circuit elements, whether in an integrated circuit, or on a printed circuit board. Such optimization typically involves compacting the individual devices (or "objects") within the allotted area, while minimizing the number and length of the interconnections. By optimizing circuit compaction, the CAD/CAM system can increase the number of components per unit area, while balancing the power consumption and heat generation of the circuitry. The reduction in interconnection length also increases the speed of signal travel through the circuit, increasing the speed of the device.

A number of attempts at compaction of these devices have been made. Several existing approaches include branch-and-bound methods that use brute force to enumerate the permutations of object locations and calculating costs of different placements. These methods are unfortunately very costly in time and the numbers of calculations required, and often cannot handle arbitrarily-shaped objects. Simulated annealing methods provide an improvement over the random placement approach by moving objects according to a Boltzmann distribution. Convex optimization methods are wire-length (interconnection) driven: first, all interconnections are minimized and then each object is pushed apart until there are no overlaps. Slicing-tree optimization can also used, whereby the area for placement is continually sliced into smaller areas until each object fits into exactly one area. This method is useful for rectangular shaped objects, but not for general shapes or for including wire-length calculations.

Current methods for compaction and placement optimization of electrical devices do not provide a simple and flexible method for handling irregularly shaped objects. These current methods do not provide accurate results while minimizing the computation time required. In addition, many of the methods solve only one portion of the compaction problem, such as minimizing compaction area or minimizing interconnection lengths, but do not provide an overall approach for optimizing all aspects of the layout problem. What is needed is an improved method and apparatus for optimizing the layout of electrical components. An improved technique for two-dimensional compaction should provide a simple, inexpensive and time-economical approach for quickly compacting any number of devices. The improved apparatus and method should provide a flexible approach that easily adapts to any particular problem, and that is readily applicable to integrate circuit design, multi-chip modules layout and printed circuit board arrangements.

SUMMARY OF THE INVENTION

In accordance with the present invention, a multiple-layer contour searching method and apparatus for two-dimensional compaction begins with a generalized layout problem consisting of a group of objects and an area in which to compact these objects. The objects can consist of more than one layer, and each layer of an object can have an arbitrarily shaped boundary. The set of objects are initially included in a set of unrefined objects. The objects are placed in an initial, uncompacted (unrefined) configuration within the area. Given an initial compaction direction for the area defining a top and bottom for the area, the unrefined configuration of unrefined objects is placed at the top portion of the area. The set of refined objects is usually initially empty, and comprises a refined configuration of objects located at the bottom of the area.

An unrefined profile (defined by the lowermost portion of the unrefined configuration) is defined, as well as a refined profile (defined by the uppermost portion of the refined configuration). If the objects have multiple layers, each layer will have its own unrefined and refined profiles. Once the initial dam structures and conditions are defined, the compaction method and apparatus selects one object at a time from the unrefined object set. A position is found for the object along the refined profile that provides a lowest cost for the overall arrangement of objects. The object is then moved to the refined object set, and the unrefined and refined configurations are updated as well as the unrefined and refined profiles.

The process continues in the same compaction direction by choosing each unrefined object in turn, finding a position of lowest cost for it, and updating the data structures. Once all unrefined objects have been chosen, another compaction direction can be chosen and the process can begin again. Any number of compactions in different directions can be made, limited only by computation time and expense. The method will quickly approach a maximum compaction state, after which further compactions will yield no better improvement.

The present invention employs novel and efficient means to calculate the costs used to find the best position for each object. One primary cost component is that of the total size in the compaction direction. To find the object position minimizing this size, the invention uses both an upper and a lower object location curve. The location curves comprise the vertical distance of a reference point on the object as the object is placed around the unrefined and the refined profiles respectively. Break points on the location curves (i.e., positions where the object position makes jumps) are the only points that are examined as potential locations for the object. If the particular position provides a size greater than the current "best" size for the compacted group of objects, that position is pruned and discarded. If the position potentially provides a better (lesser) size, the point is more carefully examined. First, the invention determines whether the object actually can fit at that point. If it can, the cost is rigorously determined, the new bounds are recorded, and the new configuration is determined.

The invention allows for more than just the total height of the compacted objects to be included in the cost minimization procedures. Changes in connection net length can also be included as well, to allow the invention to minimize both area and connection length. The invention provides methods of tracking individual connection nets and efficiently determining changes in net connection lengths, given the change of position of an object, and the changing compaction size of the collection of objects.

The methods and apparatus given by the present invention provide a simple and powerful means for compacting electrical components to design more dense, space and energy efficient circuitry capable of operating at greater speeds. The methods and apparatus of the present invention provide novel techniques for compacting any group of electrical devices at any scale, including integrated circuits, multi-chip modules, and printed circuit boards that combine groups of discrete components. These and other features and advantages of the present invention are apparent from the description below with reference to the following drawings.

BRIEF DESCRIPTION OF THE DRAWINGS

FIG. 2 shows a flow chart of the operation of the present invention.

FIG. 4 shows a schematic diagram of a series of memory caches for storing alternative object profiles.

FIGS. 10A and 10B show an object on a refined profile and the beginning of a corresponding object location curve.

FIGS. 11A and 11B show an object on a refined profile and the continuation of a corresponding object location curve.

FIGS. 12A and 12B show an object on a refined profile and the continuation of a corresponding object location curve.

FIGS. 16A and 16B show an object on an unrefined profile and a corresponding unrefined object location curve.

FIG. 18 shows a typical set of interconnection nets and an object to be placed in accordance with the present invention.

FIGS. 19A through 19C show three possible states (covariant, invariant and contravariant) of a given interconnection net.

DESCRIPTION OF THE PREFERRED EMBODIMENTS

Figure 1:
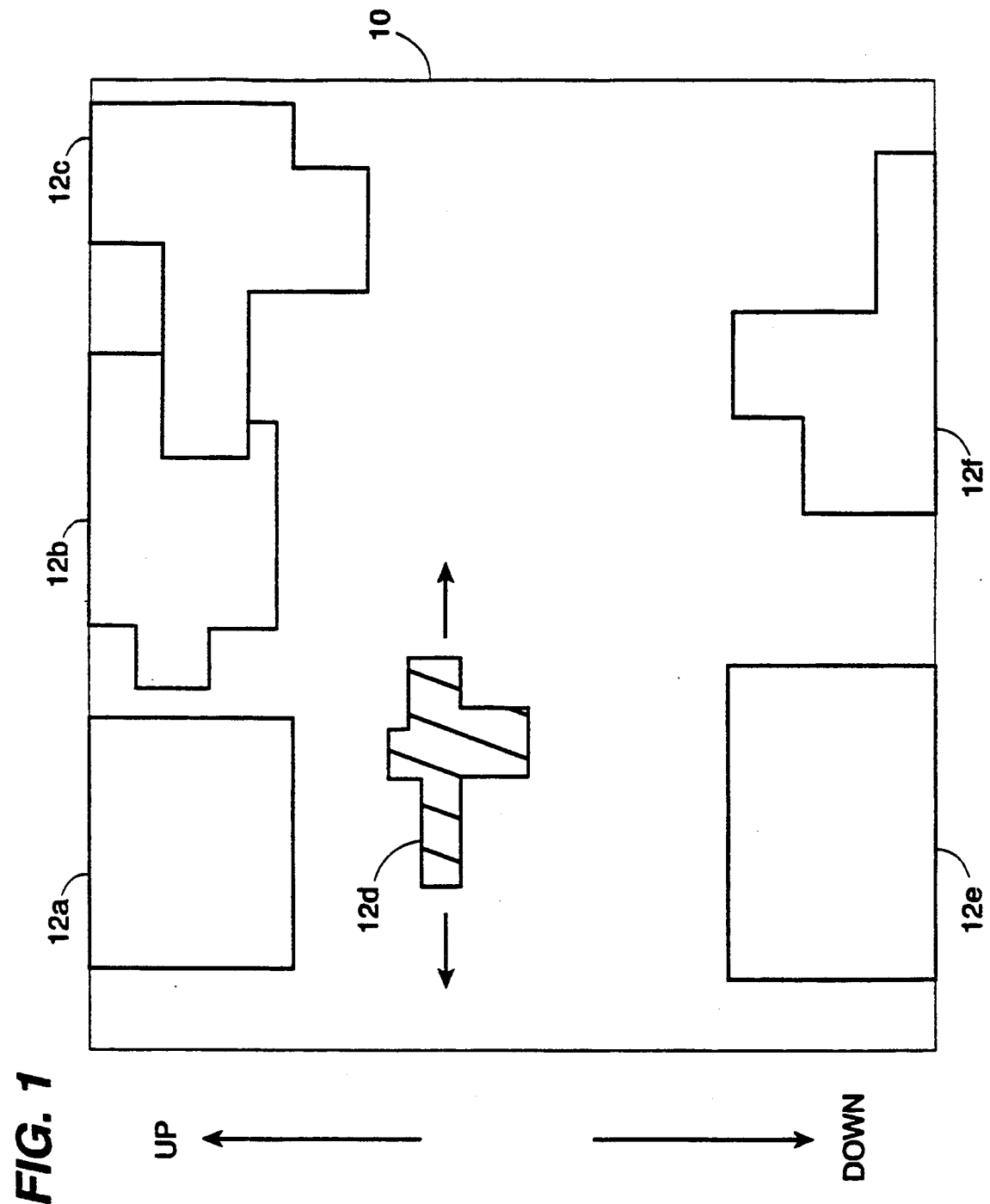
FIG. 1 shows a schematic diagram of an object layout problem.

In accordance with the present invention, a generalized layout problem as shown in FIG. 1 begins with a set of objects 12 located within an object placement area 10. Some objects 12a, 12b and 12c may be placed at the upper end of the area, while other objects 12e and 12f may be placed at a lower end of the area. A given object 12d can be moved anywhere within the area. Each object can be shaped in an arbitrary way, only limited by actual design constraints for an individual component. Throughout the invention, the word object comprises any type of electrical component. For instance, in designing an integrated circuit, an object can be an individual discrete device, such as a MOSFET transistor. Or it could be a group of circuits pre-compacted into one unit, such as a memory register. In a multi-chip module, each object can comprise an individual integrated circuit wafer; in printed circuit board design, an object can comprise each discrete component. In general, a given object can take a variety of forms and can be oriented in a variety of ways. Therefore, the present invention can record each separate profile of the object in its myriad forms, and test each profile (if desired) for an optimal fit.

Figure 5C:
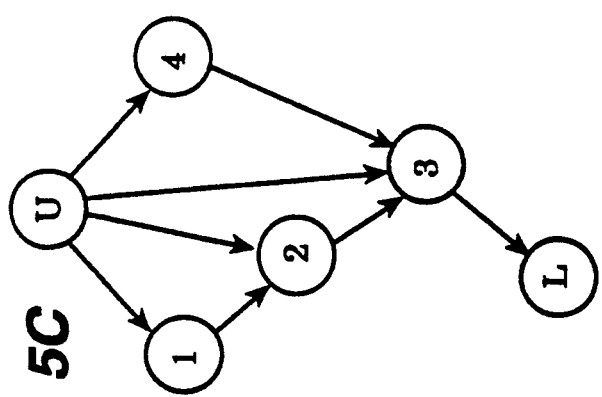
FIGS. 5A through 5E illustrate the operation of the present invention in setting up initial data structures, configurations and profiles in accordance with the present invention.
Figure 5E:
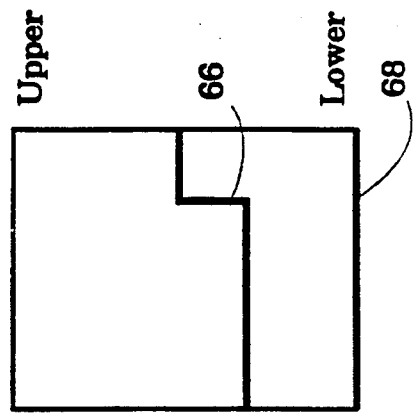
Figure 5B:
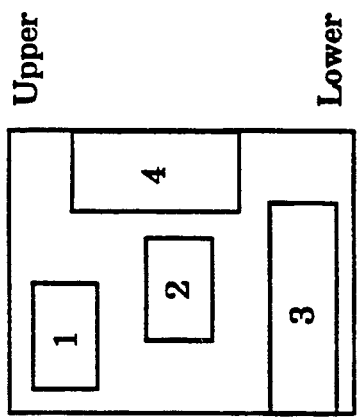
Figure 5D:
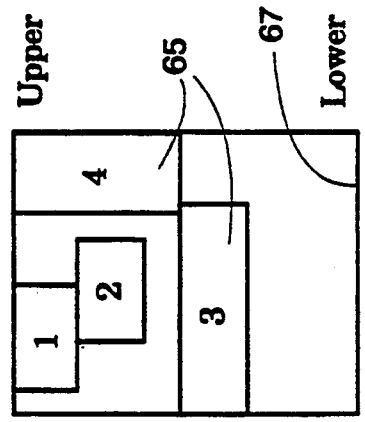
Figure 5A:
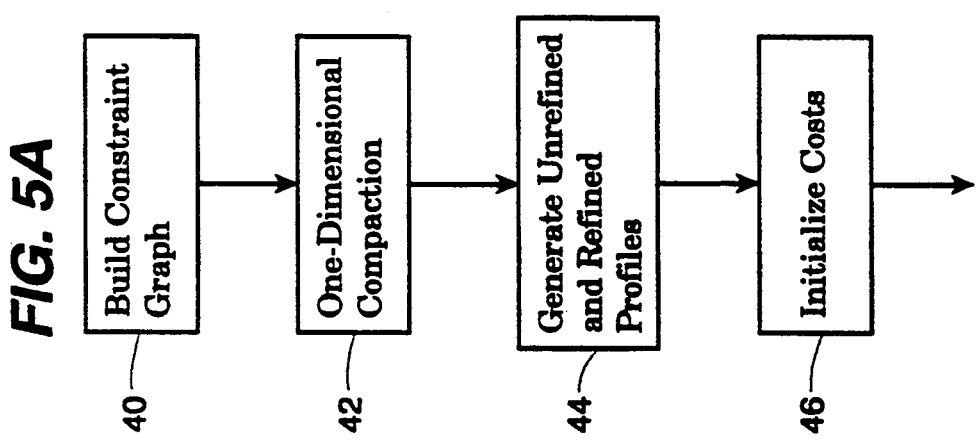
Figure 8:
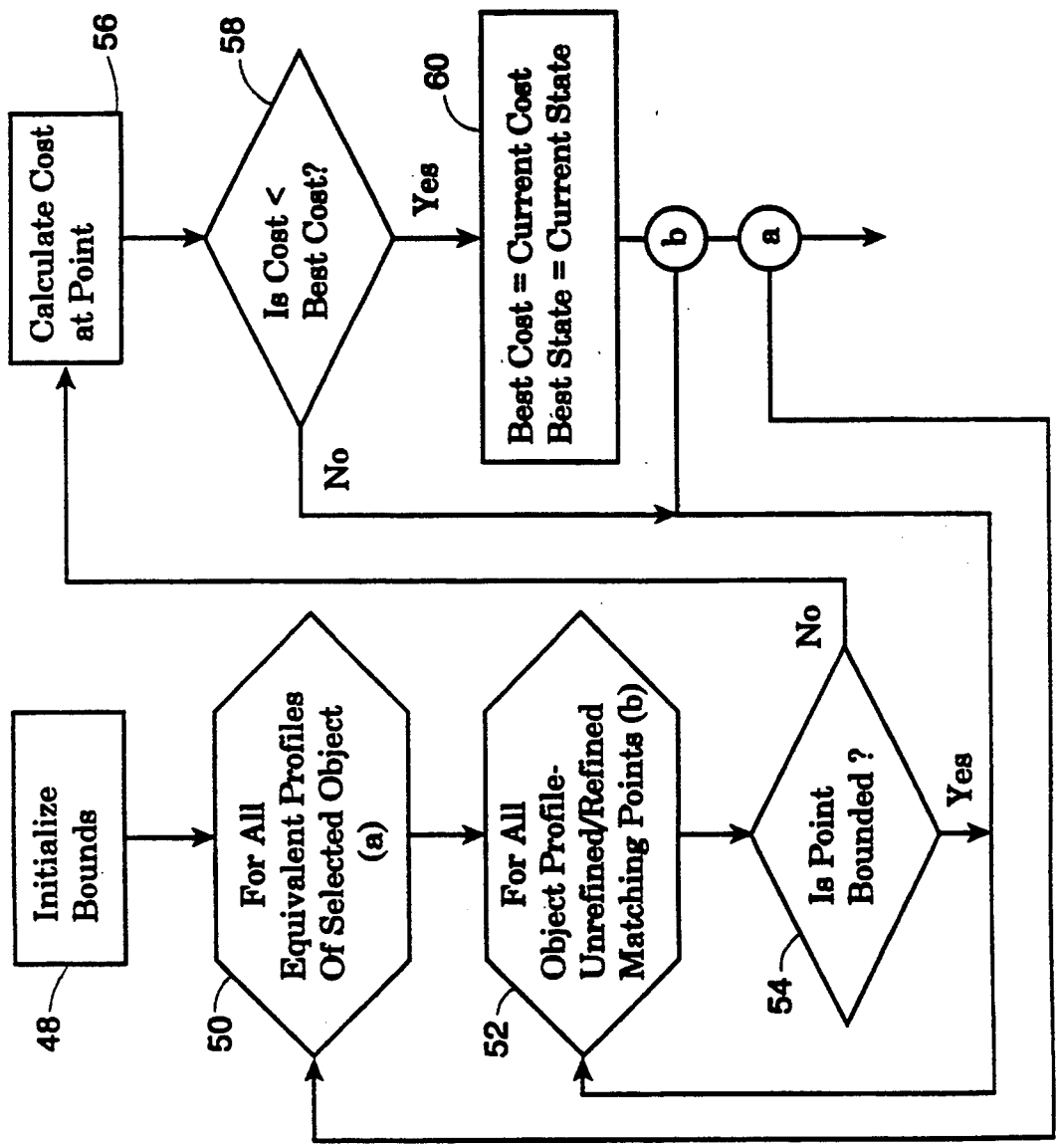
FIG. 8 shows a flowchart illustrating the operation of the present invention in contour searching for the optimal placement of an object.

The flowchart of FIG. 2 describes the general procedures of the present invention, while flow charts of FIGS. 5A and 8 describe in detail particular steps. First, a set of data structures are constructed for each object included in the particular circuit layout. These structures are illustrated in FIGS. 3A through 3D and FIG. 4. Each object 12 can comprise an arbitrary shape, as seen in FIG. 3A. Each object 12 will have a boundary, or object profile 14 surrounding its area. While the object 12 shown is rectilinear and fixed in size and shape, those skilled in the art will realize that many objects can be "soft": i.e., can change their aspect ratio, overall size or shape to fit particular design needs. In addition, individual objects may have rounded shapes. For the purposes of the present invention, a rounded object can be approximated by a series of rectilinear segments.

For each particular orientation of the object (such as that shown in FIG. 3B), line segments 16 of the object 12 perpendicular to the orientation direction (termed object profile segments) can be recorded, having a length, distance and orientation from a particular reference point of the object, such as point 15. It is important, as seen below, to categorize the beginning and ending points (as defined left to right, given the Up orientation of the object) of each object profile segment as convex or concave. For example, point 21a is a convex begin point, since an interior angle 21b from the previous line segment to the current object profile segment 16b is less than 180 degrees. Similarly, point 23a is a convex end point of the object profile segment 16b, since it ends the segment (going left to right as defined by the vertical orientation "Up" of the object) and the interior angle 23b is also less than 180 degrees. Conversely, point 25a is a concave begin point of an object profile segment 16c, since it begins the segment and its associated interior angle 25b is greater than 180 degrees. And point 27a is a concave end point of object profile segment 16a, since it ends the segment and its interior angle 27b is also greater than 180 degrees.

Figure 3C:
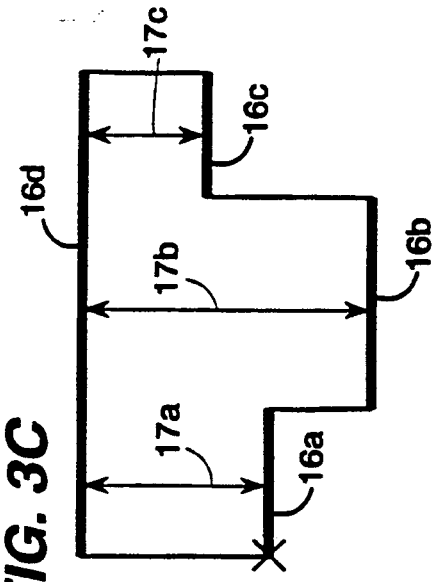
FIGS. 3A through 3D show block diagrams of a rectilinear object and the organization of corresponding profile data structures in accordance with the present invention.
Figure 3D:
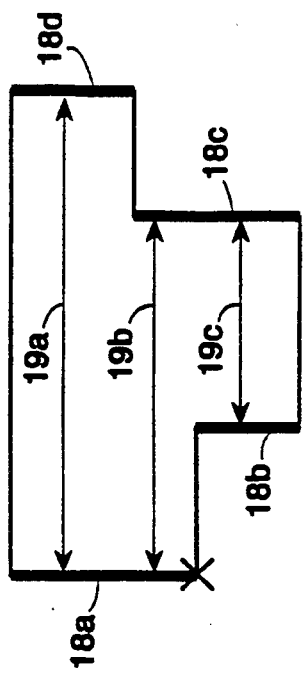
Figure 3A:
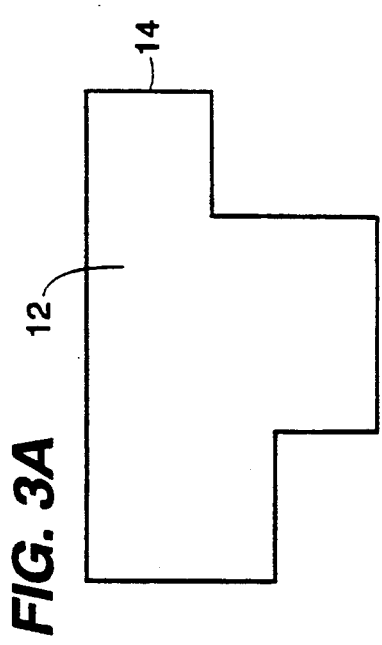
Figure 3B:
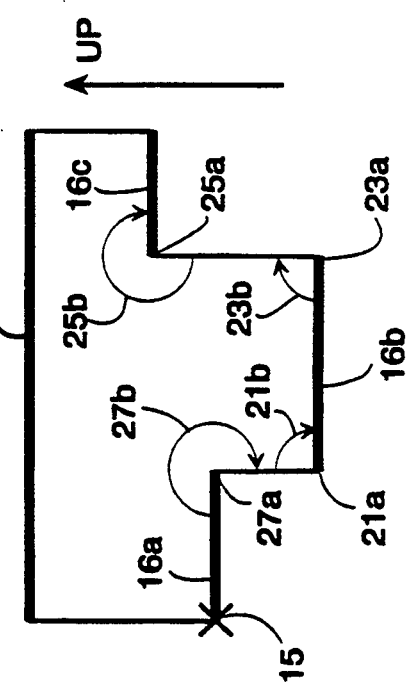

Given the UP vertical orientation of FIG. 3B, the individual horizontally-oriented object profile segments 16a through 16d are linked by vertically-oriented profile connectors 17 to each other, as seen in FIG. 3C. Similarly, for a horizontal orientation of the object, vertically-oriented object profile segments 18a through 18d are linked by horizontally-oriented profile connectors 19a through 19c, as shown in FIG. 3D.

A set of data memory caches 61a, 61b, etc. can be created to store the object profile segments. The caches also store the beginning and ending points of the profile segments along with these point's characteristics such as convex/concave and begin/end, for each particular object orientation, as seen in FIG. 4. In addition, the caches store a link list comprising a series of pointers pointing from one line segment to the next. These link lists facilitate rapid searching of profile segment points during the searching routines discussed below. A given orientation of the object (such as UP in FIG. 3B) yields two sides of the object, for example, the bottom side comprising a link list of segments 16a, 16b and 16c, and the top side comprising a link list of one segment, 16d.

In the case of a general, rectilinear object 12 having multiple layers 62 and 63, data memory caches can store various orientations of the object 62a, 62b and 62c, etc. can be stored along with the data for the appropriate object profile segments for that orientation. For soft objects, such as object 64, a variety of different aspect ratios or object sizes 64a through 64c can be stored in a similar manner. As will be discussed further below, information about the interconnections of the various objects can also be generated and stored at this time.

Once the data structures for all the objects are created and stored, Step 22, the main procedures of the present invention can proceed. As shown in FIG. 2, a first While Loop, Step 24, iterates a series of compactions of the objects, until some threshold or decision point is reached to stop. The stopping point may occur after the marginal compaction of the last cycle is less than some threshold. Or a preset number of compactions may be determined in advance. For each compaction cycle, a compaction direction will be chosen, Step 26. The compaction direction determines the up and down orientations within the object area as shown in FIG. 1. For this compaction direction, the contour search structures are prepared, Step 28. This step is further described in the flowchart of FIG. 5A and the accompanying FIGS. 5B through 5E. For the first compaction, the objects may be placed in a random organization within the object area, as shown in FIG. 5B, with object numbers 1, 2, 3 and 4. In subsequent compaction cycles, the compacted configuration of the previous cycle will be used to start the new cycle. Given the organization of objects as seen in FIG. 5B, a constraint graph can be constructed, Step 40, as shown in FIG. 5C, showing critical compaction paths of the objects. From the constraint graph, each object is compacted vertically in one-dimension, Step 42, as shown in FIG. 5D. All the objects compacted toward the top, or ceiling of the area are termed unrefined objects, the particular grouping of objects being called an unrefined configuration. Next, an unrefined profile 66 (FIG. 5E) is constructed, Step 44, as a line connecting the lowest points along the unrefined configuration 65 of FIG. 5D. A refined profile 68 is also constructed, Step 44, as line connecting the highest points along the refined configuration 67 of FIG. 5D. Initially, there are no refined objects within the initial refined configuration, and so the refined profile 67 is initially a straight line along the bottom, or floor of the area. (It is possible to practice the invention starting with a refined configuration that is not empty: a certain number of objects might be randomly placed at the bottom of the area, for example). Finally, the cost of the initial configuration is defined. In a simple form, this cost can be merely the vertical height of the current configuration, if one moved the refined and unrefined profiles together until they touched. As described further below, this cost can be generalized to include interconnection wire lengths and other relevant constraints.

Figure 6:
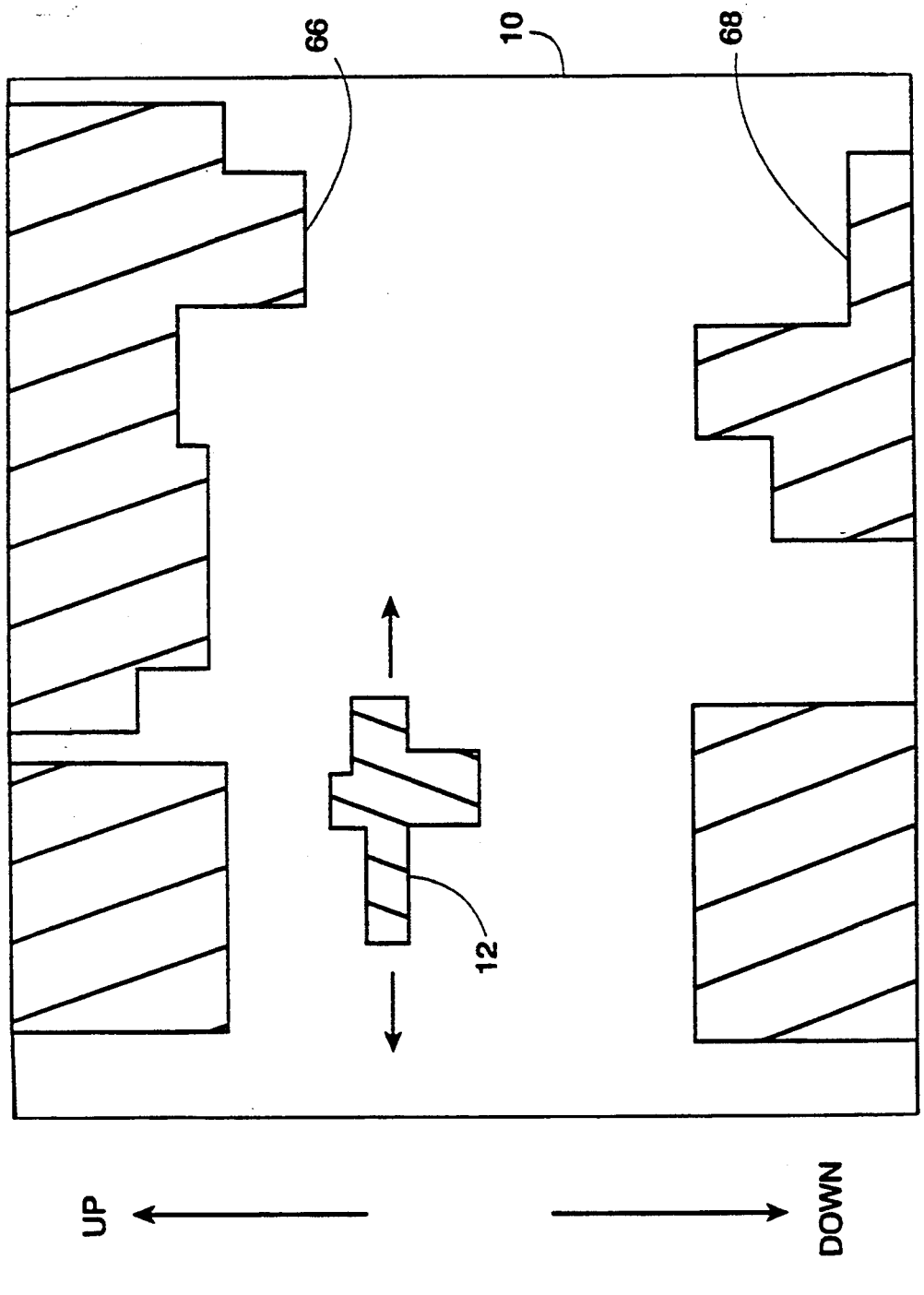
FIG. 6 shows a block diagram of an unrefined and a refined configuration converted to a set of profiles in accordance with the present invention.
Figure 7:
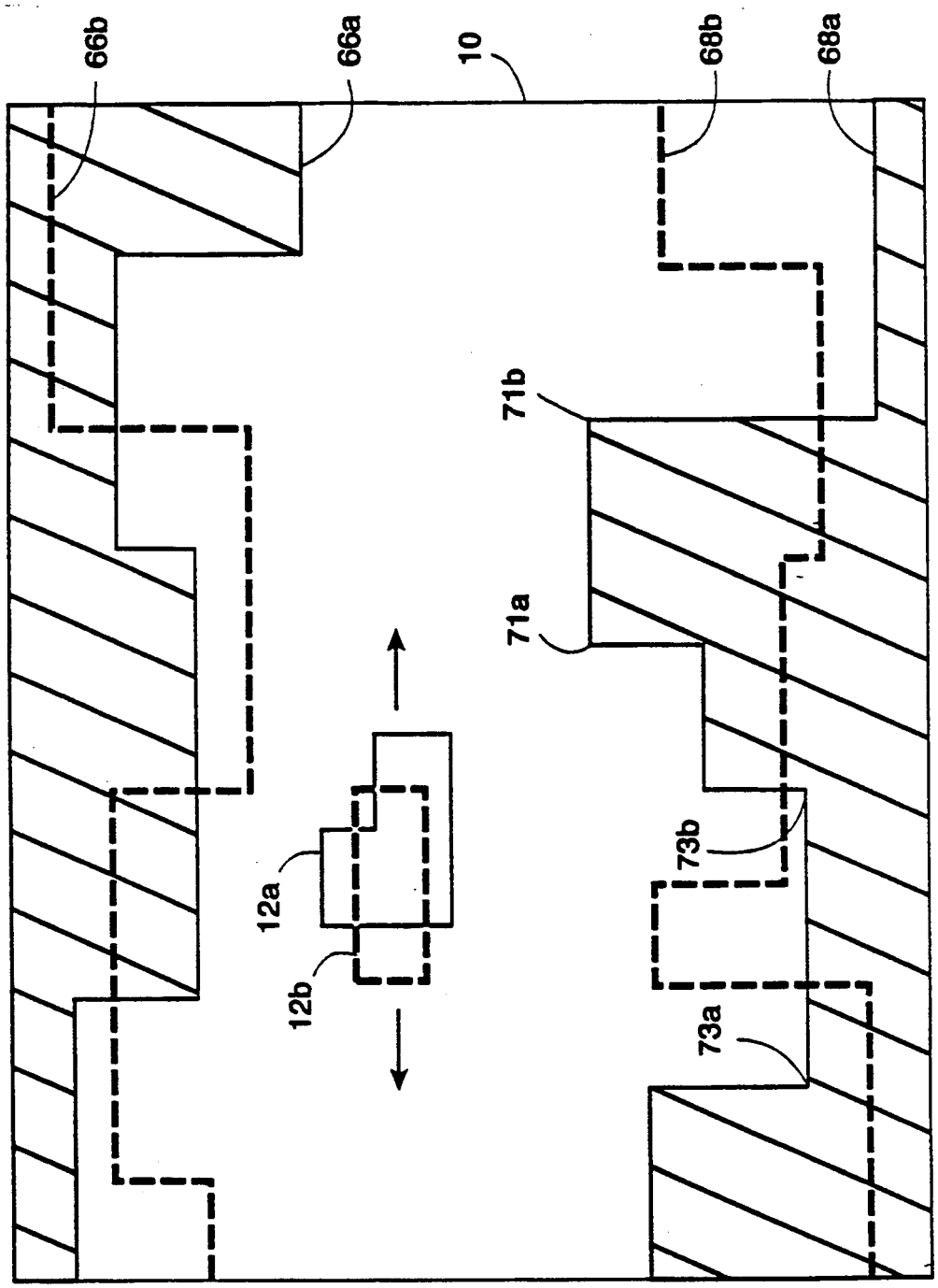
FIG. 7 shows multi-layer profiles of a typical multi-layer placement problem in accordance with the present invention.

FIG. 6 shows unrefined and refined profiles 66 and 68 for the object configurations shown in FIG. 1 In general, as shown in FIG. 7, each object 12 can have multiple layers 12a and 12b, and these multiple layers can combine in a particular configuration to provide a refined and an unrefined profile for a first layer, such as profiles 66a and 68a, and a second set of refined and unrefined profiles for a second layer, such as profiles 66b and 68b. FIGS. 6 and 7 show one and two-layer problems mid-way through a compaction, such that some of the objects have been placed in a refined configuration having a refined profile 68 located at the floor of area 10, while the rest of the objects remain in an unrefined configuration having an unrefined profile 66 at the ceiling of area 10. As seen in FIG. 7, each beginning and ending point on a profile can also be categorized as convex or concave, in the same way as was done for each object. For example, points 71a and 71b are convex beginning and ending points respectively, while points 73a and 73b are concave beginning and ending points respectively. As each new version of the refined and unrefined profiles are constructed, a listing of beginning and ending, convex and concave points are calculated and stored along with other profile information.

While there are still unrefined objects in the unrefined configuration, Step 30 FIG. 2, an object 12 is selected from the set of unrefined objects, Step 32. The preferred embodiment of the present invention begins selection of unrefined objects from those that are in the longest critical path. For example, an unrefined configuration having the critical paths shown in FIG. 5C would have object 3 as the lowest unrefined object on the longest (U-4-3-L) critical path, in FIG. 5D. Therefore object 3 would be chosen first. Next, object 4 would be chosen and so on. To facilitate the choice of objects, a front list can be kept, generated during the initialization routines, that orders the objects in the critical path list of FIG. 5C in order of choice.

Once a particular object is selected, the contour search 34 of the present invention is performed. The methods for contour search 34 are shown in the flowchart of FIG. 8. First, the bounds of the iteration are initialized, Step 48. That is, the optimal configuration of refined objects is noted along with the best cost discovered so far. A While Loop 50 iterates through all the equivalent profiles of the selected object 12 (such as those shown in FIG. 4, object profiles 62/63 or 64). For each orientation of the object, matching points between the object and the refined and unrefined profiles are discovered, Step 52. This process is best illustrated in a series of figures, FIGS. 9 through 17.

Figure 9B:
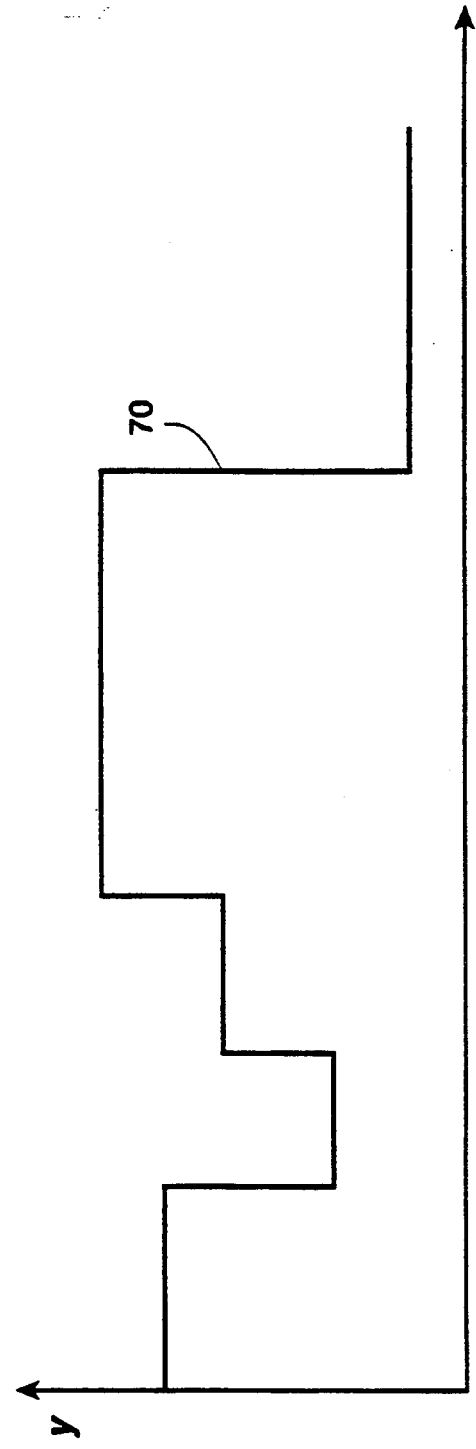
FIGS. 9A and 9B show an object on a refined profile and the corresponding object location curve.
Figure 9A:
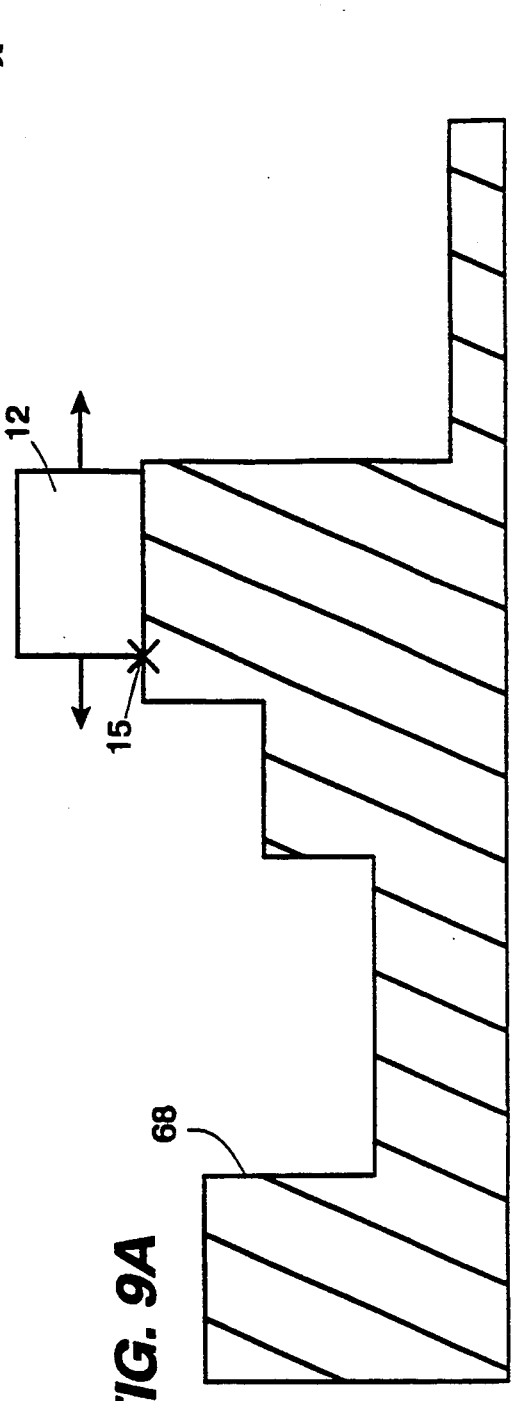

As shown in FIG. 9A, the object 12 can be moved along the current refined profile 68. The reference point 15 sweeps out a line in space termed an object location curve 70. The object location curve associated with the refined profile is termed the refined object location curve, while the curve associated with the unrefined profile is termed the unrefined object location curve. The y axis of the object location curve graph shown in FIG. 9B is the vertical distance of the compacted objects, while the x direction represents the direction for movement of the selected object 12, perpendicular to the compaction direction.

While the operation of the present invention is best described in terms of a continuous object location curve, the present invention actually simplifies the procedure by following a simple rule. In order to create the full object location curve 70, it suffices to place the object along the particular configuration profile such that only those points where either (1) a convex begin point of the object meets a concave begin point of profile, or (2) where a convex end point of the object meets a convex begin point of the profile are found. This rule is illustrated in FIGS. 10 through 13, where line 70 of FIG. 9 is constructed by placing object 12 only at those places along the profile specified by the rule.

As seen in FIG. 10A, object 12 is initially placed in the far left corner of the refined profile 68 (x=0), and the position 15a of reference point 15 is marked along the y-axis. The upper surface of profile 68 can be divided in a series of refined profile segments 68m, n, o, p and q, perpendicular to the compaction direction y. Each of these segments has a beginning and ending point that is either convex or concave. Object 12 as shown here is relatively simple, having only one horizontally-oriented object profile segment that faces the refined profile 68, segment 16a. As the object 12 is moved along profile 68, matches are identified according to the rule. The first such match is as shown in FIG. 10A, at point 15b, where the concave beginning point of refined profile segment 68n meets the convex beginning point 21a of object profile segment 16a. As shown in FIG. 10B, the object location curve 70 begins to form by connecting points 15a and 15b with rectilinear line segments 70a and 70b.

As seen in FIGS. 11A and 11B, the next reference position for object 12 according to the rules is at location 15c, where the convex ending point 23a of object profile segment 16a meets the convex beginning point of refined profile segment 68o. The object location curve 70 is continued by connecting point 15b to point 15c with rectilinear line segments 70c and 70d. The process continues in FIGS. 12A and 12B by finding location point 15d, where the convex ending point 23a of object profile segment 16a meets the convex beginning point of refined profile segment 68p. The object location curve 70 is continued by connecting point 15c to point 15d with rectilinear line segments 70e and 70f.

Figure 13B:
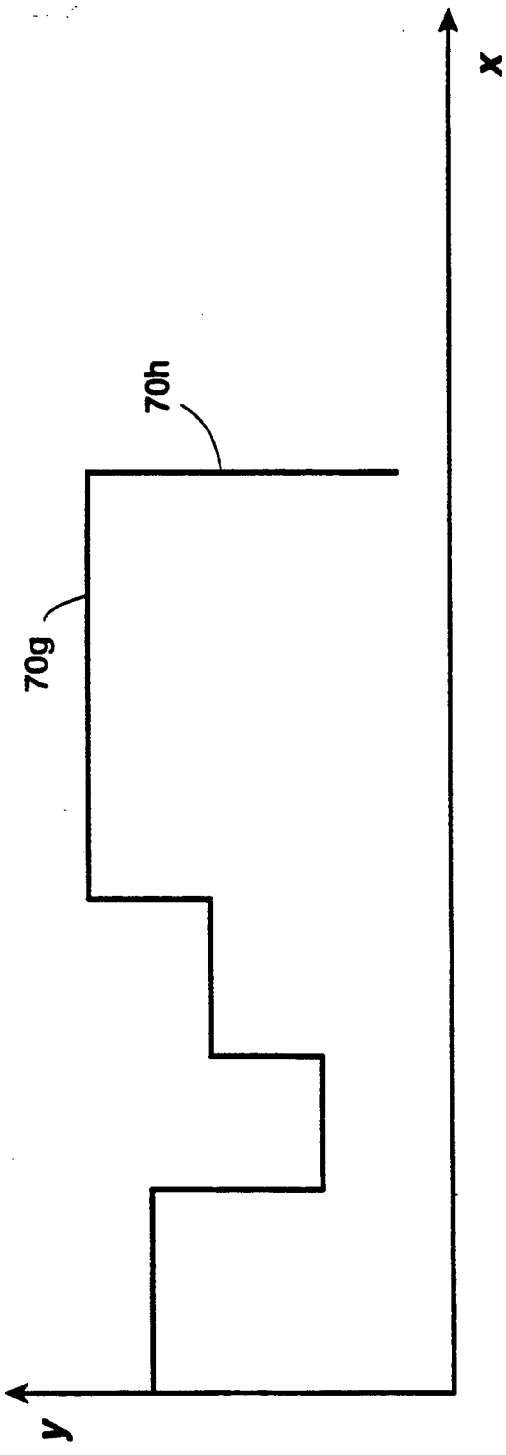
FIGS. 13A and 13B show an object on a refined profile and the ending of a corresponding object location curve.
Figure 13A:
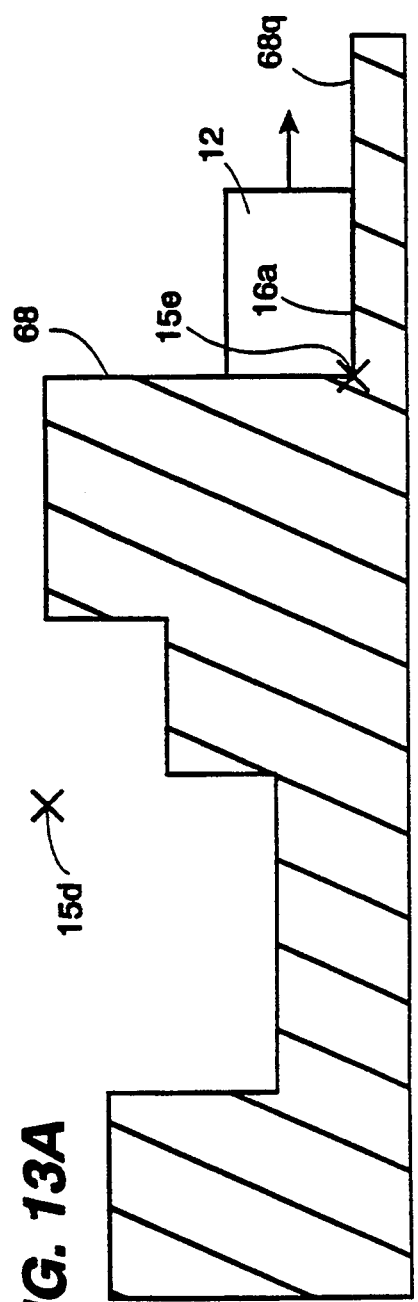

The object location curve construction continues in FIGS. 13A and 13B, by finding location point 15e, where the convex beginning point 21a of object profile segment 16a meets the concave beginning point of refined profile segment 68q. The object location curve 70 is continued by connecting point 15d to point 15e with rectilinear line segments 70g and 70h. If this point forms the last match along the profile, a horizontal line segment can be drawn from the last point 15e to the end of the object area 10, to form the object location curve 70 as shown in FIG. 9B.

Figure 14:
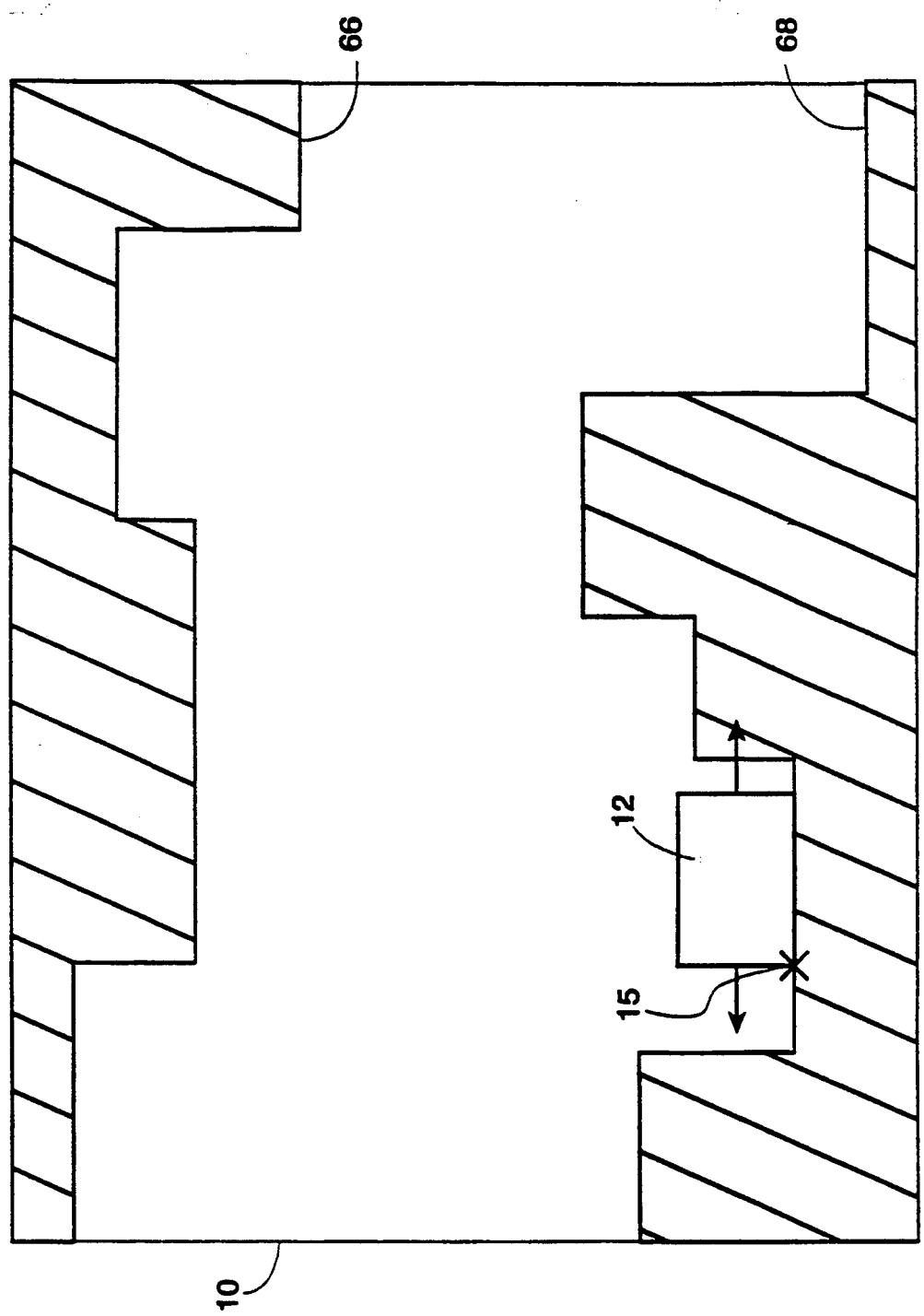
FIG. 14 shows an object, and refined and unrefined profiles within an object area.
Figure 15B:
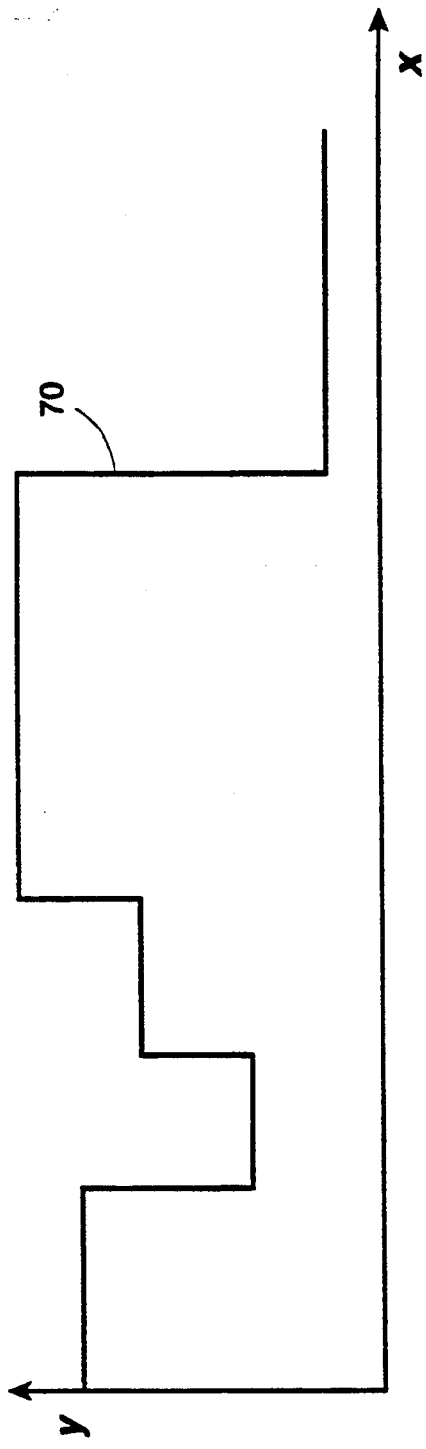
FIGS. 15A and 15B show an object on a refined profile and a corresponding refined object location curve.
Figure 15A:
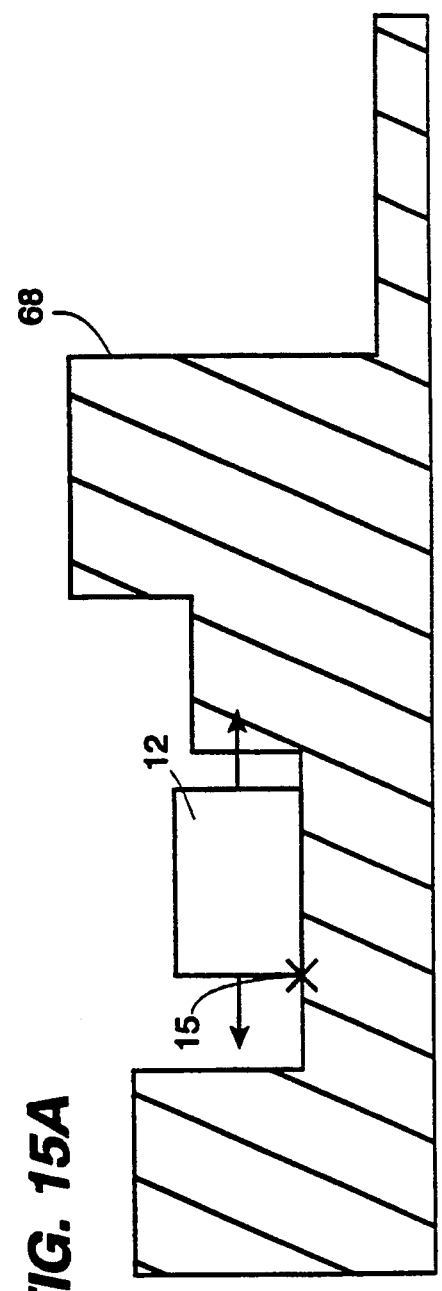
Figure 17:
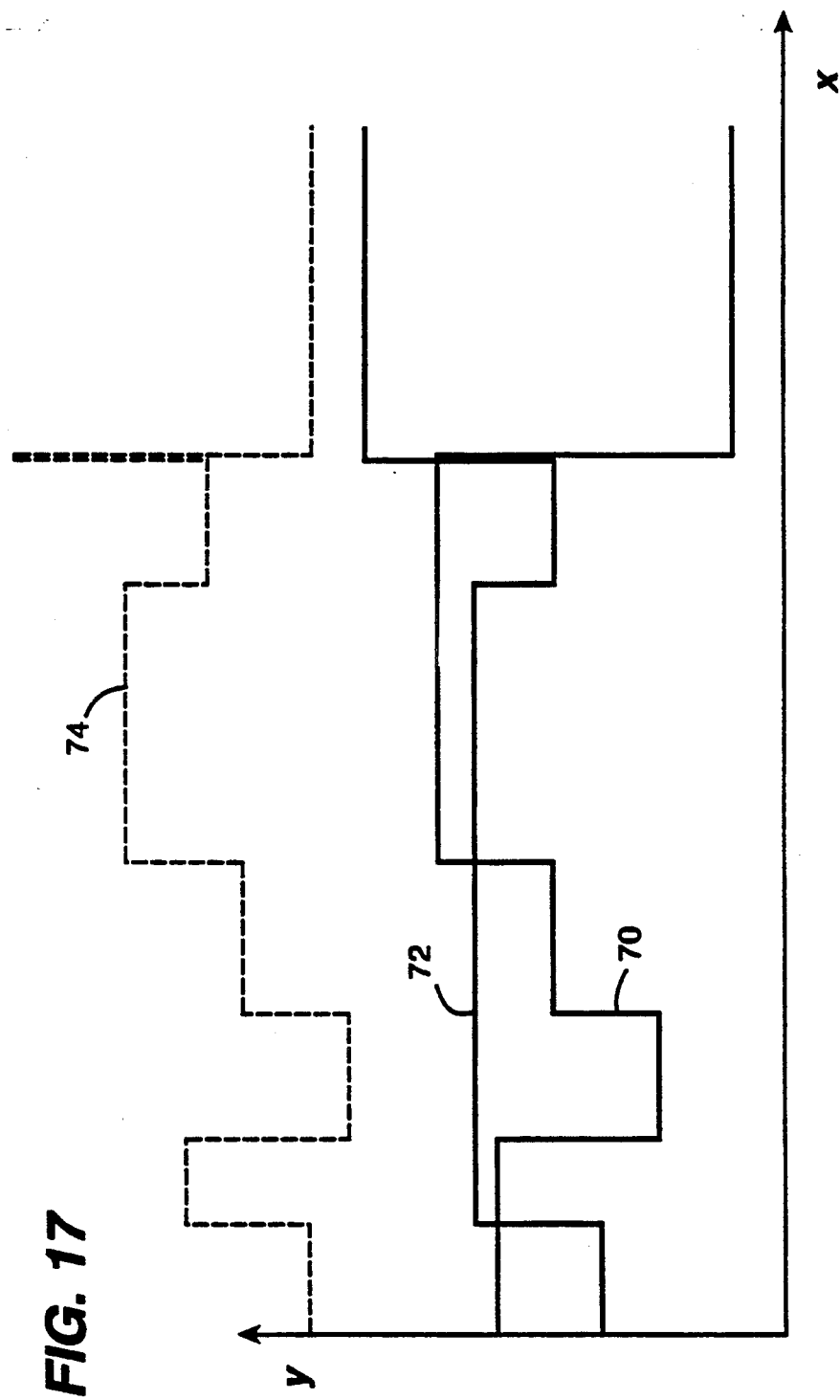
FIG. 17 shows the object location curves of FIGS. 15 and 16 added together to form a combined object location curve.

In general, the present invention confronts the problem shown in FIG. 14, namely, where to place selected object 12 within area 10 along unrefined profile 66 and refined profile 68 such that when the two areas are pushed together, the vertical height of the circuit configuration is minimized. As discussed above and shown in FIGS. 9 through 13, the present invention constructs (as shown in FIGS. 15A and 15B) a refined object location curve 70 for placing the object 12 along the refined profile 68. Similarly, the present invention constructs an unrefined object location curve 72, FIGS. 16B, showing the locations of reference point 15 while placing object 12 along unrefined profile 66. In principal, one can add these two object location curves 70 and 72 together, as shown in FIG. 17, to create a combined object location curve 74. The combined object location curve 74 shows the total height for the pushed-together collection of objects as a function of the horizontal placement of object 12.

While in principal one could construct these curves and add them together, the present invention saves computation time and expense by following rigorously the rule noted above. If the combined object location curve 74 is closely examined, it can be seen to make jumps in compaction height precisely at those points noted above in the rule. In other words, only those points where either an object's convex begin point meets a profile's concave begin point, or where an object's convex end point meets a profile's convex begin point need examination. Of course, a variety of other equivalent rules can be employed to achieve the same effect. For example, the invention can examine points where an object's convex begin point meets a profile's convex end point and where an object's convex end point meets a profile's concave end point. Each of these rules is suitable for completely determining all the jumps in height of the combined object location curve 74. Hence, the present invention calculates the total cost at only those heights.

In the flowchart of FIG. 8, decision point 54 decides whether the point chosen by the rule is bounded, Step 54, by the current best cost for the current arrangement, i.e., whether the cost is already worse and therefore can be discarded or "pruned". If so, another point is chosen (While Loop, Step 52). If the cost does seem better, the point is investigated further, Step 56, by first calculating whether the object can actually exist at that point. Conceivably, matching points will exist but if the object is actually placed at that point other portions of the object will overlap the refined or unrefined profiles 68 and 66. Since overlap is not allowed, the lowest non-overlapping location of the object at the same horizontal position without overlap will be calculated. The cost of placing the object at that location can then be rigorously calculated. If the cost is actually less than the current best cost, Step 58, the new position of the object and the new configurations of the refined and unrefined profiles can be recorded as a new best state and a new best cost, Step 60. If the cost is not better than the current best, the next position for the object is selected. Regardless of whether a good position has been found at step 58, all potential positions of the object are cycled through to find any better positions. Regardless of whether a better position for the object is found, i.e. whether the object is either left in its current position or moved to its better position, the procedure removes the object from the unrefined object set to the refined object set. The process continues not only for all matching point positions of the object horizontally, Step 52, but also for all equivalent profiles of the object, Step 50.

Once the contour procedures of FIG. 8 are complete for the selected object, the contour search structures (the refined and unrefined sets and profiles) are modified as discussed above at Step 36, FIG. 2. The contour searching routines continue for all the unrefined objects in the unrefined configuration 65. After the routines for the chosen compaction direction completed, a different compaction direction may be chosen, Step 26, and the process of compaction can begin again. The process of choosing a compaction direction and compacting all objects can continue until some limit has been reached, such as a marginal improvement of compaction, or a set number of compaction iterations.

The present invention provides a general method for compacting a set of objects. The embodiment described above places each object in order to minimize a simple cost of the total height of the collection of objects in the compaction direction. The present invention can be generalized to include other costs within its calculus to minimize not only area but also other significant parameters. In particular, the present invention provides for minimizing total wire interconnection length as well as compaction area when placing objects.

The setup of the present invention, including interconnection nets, is shown in FIG. 18. Once again, the present invention takes an object 12 from the set of unrefined objects, that define an unrefined profile 66. Various interconnection nets 76 are shown. An interconnection net 76 comprises a set of pins 78 that link an object to other objects. For instance, object 12 has two interconnection nets 76b and 76c. Net 76b connects pin 78c, within unrefined profile 66, with pin 78d, within object 12. Net 76c connects pin 78e, within object 12, to pin 78f, within refined profile 68. One can readily see that moving object 12 around can increase and decrease these interconnection nets 76b and 76c. One can also see that increasing or decreasing the overall size of the object area can affect other interconnection nets that span between the refined 68 and unrefined 66 profiles, such as interconnections 76a and 76e. Furthermore, the lengths of some interconnection nets such as 76d remain unaffected by changes in the position of object 12, and consequent changes in object area size.

The different effects of changing the compaction size of the object region are shown in FIGS. 19A through 19C. The length of interconnections required to connect the pins of an interconnection net can be closely approximated by half the perimeter of a bounding box 80 that just encloses all the pins 78 of the interconnection net. A simple bounding box 80a and interconnection net connecting pins 78a and 78b are shown in FIG. 19A. This net can be termed covariant, since the box will expand as unrefined and refined regions 66 and 68 are forced away from one another, and will shrink as the regions get closer. Covariant nets have their topmost pin 78b in the unrefined region 66 and their bottommost pin 78a in the refined region 68.

FIG. 19B shows an invariant net and bounding box 80b, where the topmost and bottommost pins 78b and 78a are both on the same side (either both in the unrefined profile region 66 or both within the refined profile region 68). Other pins, such as 78c falling within the bounding box 80b can be in the other profile region, as shown. Within some tolerance set by the bounding box, the two profile regions can change their relative distance without affecting the size of the bounding box, since pin 78c will not move outside the box, as long as the change in distance is small enough.

FIG. 19C shows a contravariant net and bounding box 80c, having the topmost pin 78b reside on the refined profile 68, and the bottommost pin 78a reside on the unrefined profile 66. For contravariant nets, increasing the distance between the refined and unrefined profiles can decrease the size of the bounding box, and hence the size of the interconnection net.

Of course, changing the compaction distance too greatly can cause a net of one type to convert to another type. For example, increasing the distance between the unrefined and refined profiles of FIG. 19B too far can push the pin 78c below the bottom of bounding box, causing the net to convert from an invariant net to a covariant net. Each net can be analyzed to determine within what margin of distance change M the net will retain its character. A net that stays in the same state with an absolute compaction distance less than M is said to be a "strictly covariant/invariant/contravariant net with margin M". The types of distance change that can convert one state to another are summarized in Table 1 below.

TABLE 1

| From To | Covariant | Invariant | Contravariant |
|---|---|---|---|
| Covariant | +/− | − | − |
| Invariant | + | +/− | − |
| Contravariant | + | + | +/− |

For example, if the compaction size increases, a covariant net will stay the same, an invariant net might change to a covariant net (or stay the same), and a contravariant net might change to a covariant net, to an invariant net, or stay the same.

In addition to cataloging each net as covariant, contravariant and invariant, each net is also categorized as either a crossing net, such as 76a and 76e of FIG. 18, or an object net, such as 76b and 76c that attaches to the object 12 being moved. One can note that crossing nets stretch their bounding box only in the compaction direction, and object nets stretch their bounding box in both directions. The total wire length change resulting from moving an object 12 and changing the compaction size can be calculated as:

New Wire Length = Old Wire Length
  − Old Net Length for Object
    (at old Coordinates)
  + New Net Length for Object
    (at new Coordinates)
  + ΔWire Length for Crossing Nets Those skilled in the art can appreciate that other approximations for calculating the connecting net length can be used, such as single-trunk Steiner Tree wire length approximations. The covariance states of bounding boxes allow rapid calculation of the ΔWire Length for Crossing Nets portion of the calculation.

At each placement of selected object 12, the change in the compaction distance ΔD can be compared to the calculated margins of the various bounding boxes. If the number of strictly covariant nets for a margin M>ΔD is given by NumCovNets(M) and the number of strictly contravariant nets for a margin M>ΔD is given by NumConNets(M), then ΔWire Length for Crossing Nets = ΔD * NumCovNets($M$)
  − ΔD * NumConNets($M$)
  + ΔWire Length For
    Non-Strict Nets ($M$)

By properly choosing M such that most ΔD changes are less than M, and most nets have a tolerance greater than or equal to M, one can keep the number of non-strict nets small. The first two pans of the determination are simple, only the third portion of the calculation, for non-strict nets, is computationally intensive. For these non-strict nets, the present invention provides several options. One can treat these nets as strict nets during the contour search (to get an approximate value of wire length changes), and recalculate wire length rigorously after the contour search. Or one can perform the more rigorous determinations at each point during the contour search.

The procedure of the present invention defines a cost C for the contour search that sums both the overall compaction distance D with a value for other costs O (i.e., C=D+O). O can include the total wire length required for interconnection, and possibly the timing penalties associated with connection lengths, and the like. Each of these costs can be scaled by some factor to make them commensurate with the distance cost D. D is the primary cost used by the present invention for object placement. To facilitate calculations, an estimate of the upper bound of the change in the other costs ΔO caused by movement of the selected object can be determined. During the contour search routines described above, only certain points are retained for rigorous cost calculation. Other points are pruned by examining the change in the compaction area along with the upper bound of the change in other costs ΔO. Let Mind be the minimum compaction distance found so far. Let MinObj FloorLoc be the object location for the minimum floor (refined profile) distance discovered so far (the height of refined object location curve 70 in FIG. 15B) for placing the object. Let MinObjCeilingLoc be the object location for the minimum ceiling (unrefined profile) distance discovered so far (the height of unrefined object location curve 72 in FIG. 16B) for placing the object. Let D(ObjFloorLoc(p)) be the refined object location curve distance for point p, and D(ObjCeilingLoc(p)) be the unrefined object location curve distance for point p. Then, point p can be pruned if either:

$D(ObjFloorLoc(p)) > MinD - D(MinObjCeilingLoc) + \Delta O$ or $D(ObjCeilingLoc(p)) > MinD - D(MinObjFloorLoc) + \Delta O.$ Once the point is pruned, it is no longer examined. All other points can be more rigorously examined, as described above, finding the exact distance cost D of placing the object there, along with the other costs O.

After a final point is found for the selected object 12, each non-strict net must be evaluated to see if it changed its state. In addition, the accumulated chip size changes are compared with the margin of all nets to evaluate whether strict nets have changed their states. As a precaution some threshold value less than M, such as 0.5*M, can be used. All nets would be reevaluated when the accumulated chip size changes crosses the lower threshold. After these steps, any new states of the nets will be recorded along with any new margin M for the nets. As described above, the contour search procedure 34 is performed for each object in the unrefined object set, for each compaction direction. When all compaction directions have completed, the final configuration of objects and relevant information such as the object locations, orientations, or soft block shapes, in addition to interconnection nets, are output as data 38. This output data can then be employed by other portions of a CAD/CAM system to construct actual layouts and masks for placing electrical components within physical areas.

Figure 21:
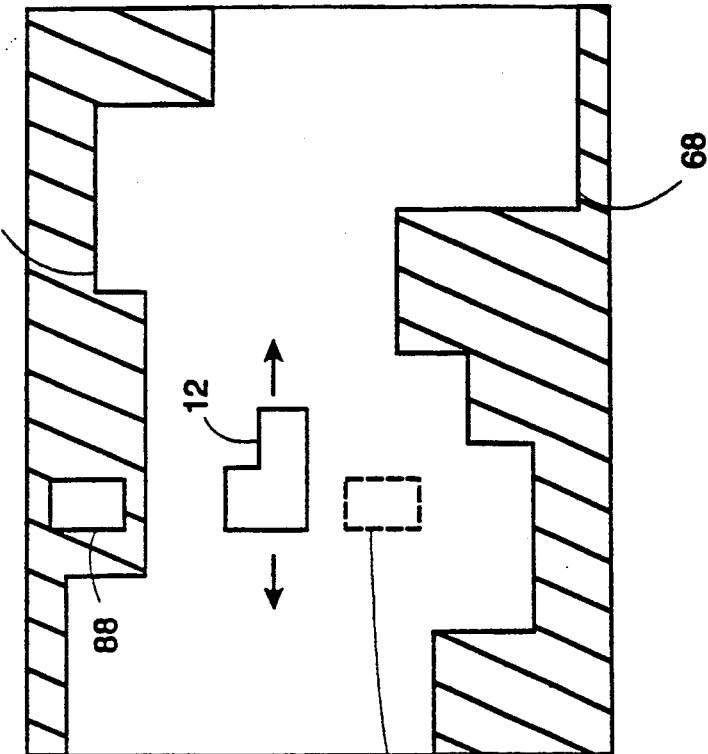
FIG. 21 shows another use of the present invention to provide for preplacement of objects, or reserve areas for non-placement.
Figure 20:
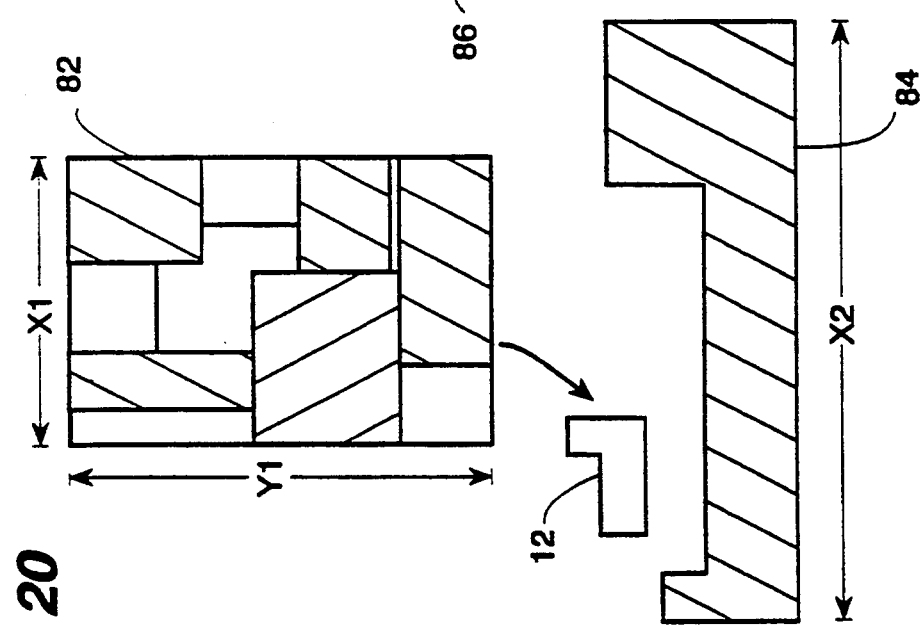
FIG. 20 shows one use of the present invention to compact a set of objects into a different aspect ratio area.

Further examples of the flexibility of the present invention are shown in FIGS. 20 and 21. FIG. 20 illustrates use of the compaction processes to specify a particular aspect ratio for a collection of compacted objects. First compacted collection 82 has an area specified by horizontal distance X1 and vertical distance Y1, giving a total compacted area X1*Y1. Given that area as a first "seed" area for the eventual compaction area of the collection, one wants to create a different aspect ratio: i.e., given that area, one wants the horizontal distance to equal X2 as shown in the refined configuration area 84. To do this, one practices the invention as described earlier, using the first configuration 82 as the initial unrefined configuration, and defining the floor of the device as having a horizontal distance X2 for placing refined objects. Several iterations may be necessary for the compacted collection of objects to relax into a compacted configuration closely approximating the desired aspect ratio.

Another use of the present invention is that of preplacing objects or reserving areas for non-placement. FIG. 21 shows the same general object configuration shown in FIG. 14, but one object 88 is pre-placed. While object 88 remains unchosen in the unrefined profile, a space 86 within the refined profile area will be reserved for it. Before object 88 is selected, all the selected objects will be checked for overlap of reserved space 86 during the search and placement process. When object 88 is finally selected, it will be moved directly to the reserved space 86 without further checking.

Figure 22:
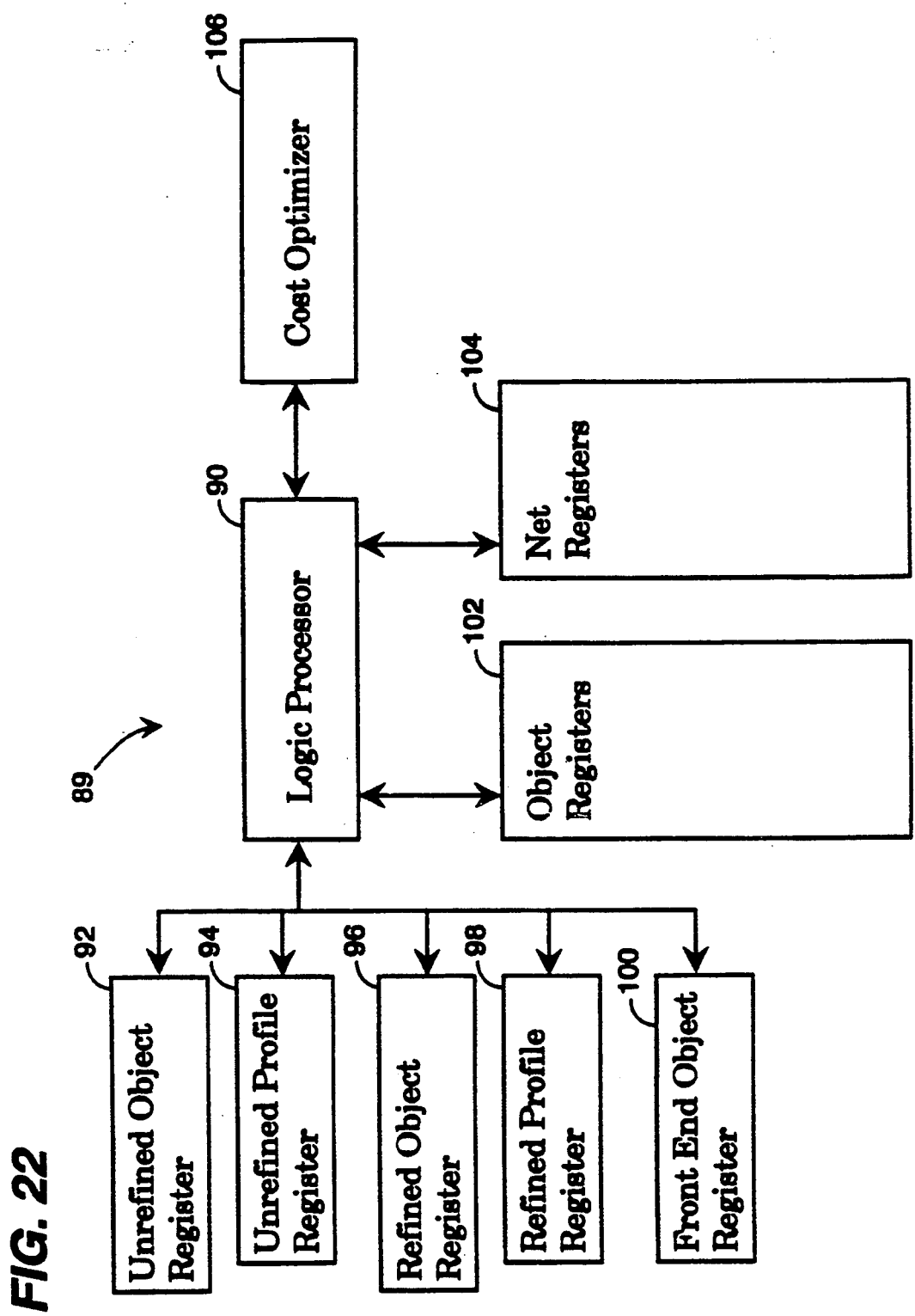
FIG. 22 shows apparatus for compaction in accordance with the present invention.

FIG. 22 shows apparatus 89 of the present invention in block diagram form. A logic processor 90 controls the processes of the present invention and is connected electrically to a series of memory registers. Unrefined object register 92 stores relevant data for which objects are within the unrefined object set. Unrefined profile register 94 stores data defining the current unrefined object profile. Similarly, refined object register 96 and refined profile register 98 store information concerning the locations of current refined objects and their consequent profile. A front end object register 100 stores critical path information for each object for chosing the next object to search. Object registers 102 store basic information for each object and its layers, including its multiple orientations, its profile segments, their classifications, etc. Net registers 104 store information concerning the connection nets, including the objects each net attaches to, current information concerning net types (covariance, crossing, object, etc.), and each net's margin. Logic processor 90 works in conjunction with a cost optimizer module 106 (implementable in hardware or software) to take each object from the unrefined object register and find optimal locations to place the selected object in relation to the other refined objects in refined object register 96. When unrefined object register 92 is empty, the cost optimization process for one compaction direction has completed. As discussed above, the compaction procedures continue in different directions until a chosen threshold is reached.

While the present invention has been described with reference to preferred embodiments, those skilled in the art will recognize that various modifications may be provided. For example, for a given compaction iteration, a contour search may not be used to place every unrefined object into the refined object set. Some objects may be placed randomly (particularly when beginning the process). Those practicing the invention can freely choose how many different orientations of the object (if any) to try for better placement. As mentioned, various entirely equivalent formulations can be used as a pruning rule for examining specific placement sites. Various object reference points can be chosen; different approximation techniques for estimating wire length can be chosen. Other costs of placement can be added as necessary for more completely modeling the optimization problem. A number of equivalent apparatus can be used to implement the present invention. These and other variations upon and modifications to the described embodiments are provided for by the present invention, the scope of which is limited only by the following claims

LIST OF REFERENCE NUMERALS

FIG. 1

10 Object compaction area
12 Object

FIG. 2

20 Method Flowchart
22 Set up Data Structures
24 Compaction Series While Loop
26 Select Compaction Direction
28 Prepare Contour Search Structures
30 Contour Search While Loop
32 Unrefined Object Selection
34 Contour Search
36 Modify Contour Search Structures
38 Output Data of Final Configuration

FIG. 3

14 Object Boundary or Profile
15 Object Location Reference
16 Horizontally-Oriented Object Profile Segment
17 Horizontally-Oriented Object Profile Segment Distances
18 Vertically-Oriented Object Profile Segment
19 Vertically-Oriented Object Profile Segment Distances
21 Convex Begin Point and Angle
23 Concave Begin Point and Angle
25 Convex End Point and Angle
27 Concave End Point and Angle

FIG. 4

61 Object Caches Storing Individual Profiles for Same Object
62 First Profile of a Multi-Layer Object in Different Orientations
63 Second Profile of a Multi-Layer Object in Different Orientations
64 Profiles of Soft Object Having Different Aspect Ratios

FIG. 5a

40 Build Constraint Graph
42 Perform Elementary One-Dimensional Compaction
44 Generate Unrefined and Refined Profiles
46 Initialize Costs (Bounds)

FIG. 5d

65 Initial Unrefined Configuration
67 Initial Refined Configuration

FIG. 5e

66 Unrefined Profile
68 Refined Profile

FIG. 7

71 Profile Convex Point
73 Profile Concave Point

FIG. 8

48 Initialize Bounds
50 Equivalent Profile While Loop
52 Object Profile/Configuration Profile While Loop
54 Bounded Pruning Calculation
56 Cost and Existence Calculation
58 Cost Comparison
60 Update Best State Values

FIG. 9

70 Refined Profile Object Location Curve

FIG. 16a

72 Unrefined Profile Object Location Curve

FIG. 17

74 Combined Profile Object Location Curve

FIG. 18

76 Wire Interconnection Net
78 Interconnection Attachment Location (Pin)

FIG. 19

80 Interconnection Net Bounding Box

FIG. 20

82 Initial Unrefined Compacted Configuration
84 Spread-out Refined Configuration

FIG. 21

86 Reserved Area
88 Pre-Placed Object

FIG. 22

90 Logic Processor
92 Unrefined Object Register
94 Unrefined Profile Register
96 Refined Object Register
98 Refined Profile Register
100 Front End Object Register
102 Object Registers
104 Net Registers
106 Cost Optimizer

What is claimed is:

1. A method for compacting a set of objects, comprising the steps of:
   (a) defining a set of N unrefined objects, each of said unrefined objects having at least one object profile, each of said objects having at least one layer;
   (b) defining a set of refined objects;
   (c) defining an object area, said object area having a vertical axis defining an upper and a lower end, said object area having a horizontal axis having a base width;
   (d) placing said set of unrefined objects within and at said upper end of said object area, said placement defining a first unrefined configuration;
   (e) removing a first removed object from said set of unrefined objects by selecting a lowest unrefined object along a longest critical path; said first unrefined configuration no longer including said first removed object, said first removed object no longer included in said set of unrefined objects;
   (f) defining a first unrefined profile for at least one of said layers of said first unrefined configuration;
   (g) defining a first refined profile for a first refined configuration, said first refined profile located within and at a lower end of said object area;
   (h) finding a lowest cost for placing said first removed object along said first refined profile by iteratively positioning the first removed object along the first refined profile at matching points selected according to a matching of a curvature between a refined side of the first removed object and the first refined profile and a matching of a curvature between an unrefined side of the first removed object and the first unrefined profile; and
   (i) placing said first removed object at a point along said first refined profile associated with said lowest cost.

2. A method as recited in claim 1 further comprising the steps of:
   (j) removing an ith removed object from an (i-1)th set of unrefined objects;
   (k) defining an ith unrefined configuration, said ith unrefined configuration comprising an (i-1)th unrefined configuration no longer including an ith removed object, said ith removed object no longer included in said (i-1)th set of unrefined objects;
   (l) defining an ith unrefined profile for at least one of said layers of said ith unrefined configuration;
   (m) defining an (i-1)th refined profile for at least one of said layers of said (i-1)th refined configuration;
   (n) finding a lowest cost for placing said ith removed object along said (i-1)th refined profile at selected matching points;
   (o) placing said ith removed object at the matching point along said (i-1)th refined profile associated with said lowest cost;
   (p) defining an ith refined configuration, said ith refined configuration comprising an (i-1)th refined configuration now also including said ith removed object, said ith removed object now included in said set of refined objects; and
   (q) and repeating steps (j) through (p) for all of said N objects.

3. A method as recited in claim 2 wherein said finding of said lowest cost further comprises the steps of:
   (a) defining a lower object location curve for said ith removed object, said lower object location curve comprising a set of possible matching points for said ith removed object along said (i-1)th refined profile;
   (b) defining an upper object location curve for said ith removed object, said upper object location curve comprising a set of possible matching points for said ith removed object along said ith unrefined profile;
   (c) defining a cost for each possible matching position of said ith removed object comprising a chip size cost as a function Of the combined height of said upper object location curve and said lower object location curve at said matching position; and
   (d) finding an actual position for said ith removed object having the lowest of said costs.

4. A method as recited in claim 3 wherein said finding an actual position for said ith removed object comprises the steps of:
   (a) defining a current best refined profile location for said ith object, said current best refined profile location having a height defined by said lower objection location surve;
   (b) defining a current best unrefined profile location for said ith object, said current best unrefined profile location having a height defined by said upper object location curve;
   (c) defining a current best combined cost as a function of a chip size cost and a connection net length cost;
   (d) defining a set of first refined matching points for placing said ith object along said ith refined profile such that a convex begin point of said ith object meets a concave begin point of said ith refined profile;
   (e) discarding any of said first refined matching points if the height of placing said ith object at said first refined matching points as defined by said lower object location curve is greater than said current best combined cost minus said height of said current best unrefined profile location;
   (f) defining a set of second refined matching points for placing said ith object along said ith refined profile such that a convex end point of said ith object meets a convex begin point of said ith refined profile;

(g) discarding any of said second refined matching points if the height of placing said ith object at said second refined matching point as defined by said lower object location curve is greater than said current best combined cost minus said height of said current best unrefined profile location;

(h) defining a set of first unrefined matching points for placing said ith object along said ith unrefined profile such that a convex begin point of said ith object meets a concave begin point of said ith unrefined profile;

(i) discarding any of said first unrefined matching points if the height of placing said ith object at said first unrefined matching point as defined by said upper object location curve is greater than said current best combined cost minus said height of said current best refined profile location;

(j) defining a set of second unrefined matching points for placing said ith object along said ith unrefined profile such that a convex end point of said ith object meets a convex begin point of said ith unrefined profile;

(k) discarding any of said second unrefined matching points if the height of placing said ith object at said second unrefined matching point as defined by said upper object location curve is greater than said current best combined cost minus said height of said current best refined profile location;

(l) calculating a current combined cost of placing said ith object at one of said undiscarded matching points, said point defining a current undiscarded matching point;

(m) if said calculated current combined cost is less than said current best combined cost, then defining said current best combined cost as said calculated current combined cost;

(n) if said current undiscarded unrefined profile location is better than said current best unrefined profile location, then defining said current best unrefined profile location as said current undiscarded unrefined matching point;

(o) if said current undiscarded refined profile location is better than said current best refined profile location, then defining said current best refined profile location as said current undiscarded refined matching point; and (p) repeating steps (l) through (o) until all of said refined matching points defined in steps (d) and (f) and all of said unrefined matching points defined in steps (h) and (j) have been explored.

5. A method as recited in claim 3 wherein said finding an actual position for said ith removed object comprises the steps of:

(a) defining a current best refined profile location for said ith object, said current best refined profile location having a height defined by said lower object location curve;

(b) defining a current best unrefined profile location for said ith object, said current best unrefined profile location having a height defined by said upper object location curve;

(c) defining a current best combined cost as a function of a chip size cost and a connection net length cost;

(d) defining a set of first refined matching points for placing said ith object along said ith refined profile such that a convex begin point of said ith object meets a convex end point of said ith refined profile;

(e) discarding any of said first refined matching points if the height of placing said ith object at said first refined matching points as defined by said lower object location curve is greater than said current best combined cost minus said height of said current best unrefined profile location;

(f) defining a set of second refined matching points for placing said ith object along said ith refined profile such that a convex end point of said ith object meets a concave end point of said ith refined profile;

(g) discarding any of said second refined matching points if the height of placing said ith object at said second refined matching point as defined by said lower object location curve is greater than said current best combined cost minus said height of said current best unrefined profile location;

(h) defining a set of first unrefined matching points for placing said ith object along said ith unrefined profile such that a convex began point of said ith object meets a convex end point of said ith unrefined profile;

(i) discarding any of said first unrefined matching points if the height of placing said ith object at said first unrefined matching point as defined by said upper object location curve is greater than said current best combined cost minus said height of said current best refined profile location;

(j) defining a set of second unrefined matching points for placing said ith object along said ith unrefined profile such that a convex end point of said ith object meets a concave end point of said ith unrefined profile:

(k) discarding any of said second unrefined matching points if the height of placing said ith object at said second unrefined matching point as defined by said upper object location curve is greater than said current best combined cost minus said height of said current best refined profile location;

(l) calculating a current combined cost of placing said ith object at one of said undiscarded matching points, said point defining a current undiscarded matching point;

(m) if said calculated current combined cost is less than said current best combined cost, then defining said current best combined cost as said calculated current combined cost (n) if said current undiscarded unrefined profile location is better than said current best unrefined profile location, then defining said current best unrefined profile location as said current undiscarded unrefined matching point:

(o) if said current undiscarded refined profile location is better than said current best refined profile location, then defining said current best refined profile location as said current undiscarded refined matching point; and (p) repeating steps (l) through (o) until all of said refined matching points defined in steps (d) and (f) and all of said unrefined matching points defined in steps (h) and (j) have been explored.

6. A method as recited in claim 3 wherein said finding an actual position for said ith removed object comprises the steps of:

(a) defining a current best refined profile location for said ith object, said current best refined profile location having a height defined by said lower object location curve;
(b) defining a current best unrefined profile location for said ith object, said current best unrefined profile location having a height defined by said upper object location curve;
(c) defining a current best combined cost as a function of a chip size cost and a connection net length cost;
(d) defining a set of first refined matching points for placing said ith object along said ith refined profile such that a convex begin point of said ith refined profile meets a concave begin point of said ith object;
(e) discarding any of said first refined matching points if the height of placing said ith object at said first refined matching points as defined by said lower object location curve is greater than said current best combined cost minus said height of said current best unrefined profile location:
(f) defining a set of second refined matching points for placing said ith object along said ith refined profile such that a convex end point of said ith refined profile meets a convex begin point of said ith object;
(g) discarding any of said second refined matching points if the height of placing said ith object at said second refined matching point as defined by said lower object location curve is greater than said current best combined cost minus said height of said current best unrefined profile location:
(h) defining a set of first unrefined matching points for placing said ith object along said ith unrefined profile such that a convex begin point of said ith unrefined profile meets a concave begin point of said ith object;
(i) discarding any of said first unrefined matching points if the height of placing said ith object at said first unrefined matching point as defined by said upper object location curve is greater than said current best combined cost minus said height of said current best refined profile location:
(j) defining a set of second unrefined matching points for placing said ith object along said ith unrefined profile such that a convex end point of said ith unrefined profile meets a convex begin point of said ith object;
(k) discarding any of said second unrefined matching points if the height of placing said ith object at said second unrefined matching point as defined by said upper object location curve is greater than said current best combined cost minus said height of said current best refined profile location;
(l) calculating a current combined cost of placing said ith object at one of said undiscarded matching points, said point defining a current undiscarded matching point;
(m) if said calculated current combined cost is less than said current best combined cost, then defining said current best combined cost as said calculated current combined cost
(n) if said current undiscarded unrefined profile location is better than said current best unrefined profile location, then defining said current best unrefined profile location as said current undiscarded unrefined matching point:
(o) if said current undiscarded refined profile location is better than said current best refined profile location, then defining said current best refined profile location as said current undiscarded refined matching point; and
(p) repeating steps (l) through (o) until all of said refined matching points defined in steps (d) and (f) and all of said unrefined matching points defined in steps (h) and (j) have been explored.

7. A method as recited in claim 3 wherein said finding an actual position for said ith removed object comprises the steps of:
(a) defining a current best refined profile location for said ith object, said current best refined profile location having a height defined by said lower object location curve;
(b) defining a current best unrefined profile location for said ith object, said current best unrefined profile location having a height defined by said upper object location curve;
(c) defining a current best combined cost as a function of a chip size cost and a connection net length cost:
(d) defining a set of first refined matching points for placing said ith object along said ith refined profile such that a convex begin point of said ith, refined profile meets a convex end point of said ith object;
(e) discarding any of said first refined matching points if the height of placing said ith object at said first refined matching points as defined by said lower object location curve is greater than said current best combined cost minus said height of said current best unrefined profile location;
(f) defining a set of second refined matching points for placing said ith object along said ith refined profile such that a convex end point of said ith refined profile meets a concave end point of said ith object;
(g) discarding any of said second refined matching points if the height of placing said ith object at said second refined matching point as defined by said lower object location curve is greater than said current best combined cost minus said height of said current best unrefined profile location;
(h) defining a set of first unrefined matching points for placing said ith object along said ith unrefined profile such that a convex begin point of said ith unrefined profile meets a convex end point of said ith object;
(i) discarding any of said first unrefined matching points if the height of placing said ith object at said first unrefined matching point as defined by said upper object location curve is greater than said current best combined cost minus said height of said current best refined profile location;
(j) defining a set of second unrefined matching points for placing said ith object along siad ith unrefined profile such that a convex end point of said ith unrefined profile meets a concave end point of said ith object;
(k) discarding any of said second unrefined matching points if the height of placing said ith object at said second unrefined matching point as defined by said upper object location curve is greater than said current best combined cost minus said height of said current best refined profile location;
(l) calculating a current combined cost of placing said ith object at one of said undiscarded matching points, said point defining a current undiscarded matching point;

(m) if said calculated current combined cost is less than said current best combined cost, then defining said current best combined cost as said calculated current combined cost (n) if said current undiscarded unrefined profile location is better than said current best unrefined profile location, then defining said current best unrefined profile location as said current undiscarded unrefined matching point;

(o) If said current undiscarded refined profile location is better than said current best refined profile location, then defining said current best refined profile location as said current undiscarded refined matching point;

(p) repeating steps (l) through (o) until all of said refined matching points defined in steps (d) and (f) and all of said unrefined matching points defined in steps (h) and (j) have been explored.

8. A method as recited in claim 2 wherein said finding of said lowest cost further comprises the steps of:
(a) defining a lower object location curve for said ith removed object for each of said layers, each of said lower object location curves comprising a set of possible matching points for said ith removed object along said ith refined profile of said layer;
(b) defining an upper object location curve for said ith removed object for each of said layers, each of said upper object location curves comprising a set of possible matching points for said ith removed object along said unrefined profile of said layer;
(c) defining a cost for each possible position of said ith removed object as the sum of the maximum of said upper object location curves and the maximum of said lower object location curves for each layer at said position; and (d) finding an actual position for said ith removed object having the lowest of said costs.

9. A method as recited in claim 1 wherein said objects comprise contiguous masked regions on a semiconductor mask.

10. A method as recited in claim 1 wherein said set of refined objects is initially empty.

11. A method as recited in claim 1 wherein said first unrefined profile comprises a line connecting the lowermost points of said first unrefined configuration of said set of said unrefined objects.

12. A method as recited in claim 1 wherein said first refined profile comprises a line along said lower end of said object area.

13. A method as recited in claim 2 wherein said ith unrefined profile comprises a line connecting the lowermost points of said ith unrefined configuration of said set of unrefined objects.

14. A method as recited in claim 2 wherein said ith refined profile comprises a line connecting the uppermost points of said ith refined configuration of said set of said refined objects.

15. A method as recited in claim 1 wherein said objects are connected by a plurality of connection nets, said cost further comprising a new cost of a connection net length among said objects as a function of a previous connection net length and a change in a chip size along the vertical axis.

16. A method as recited in claim 15 wherein said new connection net length cost is calculated by a method comprising:
(a) defining a previous connection net length cost;

(b) defining a previous object net length, said previous object net length comprising a combined net length for all connection nets attached to said ith removed object at a previous ith object location;
(c) defining a new object net length, said new object net length comprising a combined net length for all connection nets attached to said ith removed object at a current ith object location;
(d) defining a jth net change in height, said jth net change comprising said jth upper object location curve added to said jth lower object location curve at a current jth removed object location minus the summation of said jth upper object location curve added to said jth lower object location curve at an original jth removed object location;
(e) defining a total ith net change in height as a summation of said jth net changes in height from $j=1$ to $j=i$;
(f) dividing said plurality of connection nets into three types of connection nets, a first type comprising covariant connection nets, a second type comprising contravariant connection nets, a third type comprising invariant connection nets;
(g) dividing said plurality of connection nets into a set of object nets, said object nets including said connection nets attached to said ith removed object, and a set of non-object nets, said non-object nets including said connection nets not attached to said ith removed object;
(h) determining a margin M of said net change in height, said margin M dividing said plurality of connection nets into strict and non-strict nets, said strict nets remaining within their type as long as said total ith net change in height is less than margin M;
(i) if said total ith net change in height is less than margin M, then calculating said new connection net length cost as said previous connection net length minus said previous object net length plus said current object net length plus said total ith net change in height multiplied by the total of (the number of said non-object strict covariant connection nets minus the number of said non-object strict contravariant connection nets) plus a calculated connection length for said non-object non-strict connection nets; and
(j) if said total ith net change in height is greater than margin M, then determining which nets have changed type and recategorizing said changed type nets accordingly, calculating said new connection net length cost as said previous connection net length minus said previous object net length plus said current object net length plus said total ith net change in height multiplied by the total of (the number of said non-object strict covariant connection nets minus the number of said non-object strict contravariant connection nets) plus a calculated connection length for said non-object non-strict connection nets.

17. The method of claim 1 wherein an aspect ratio of the object area is altered by changing the base width before compaction.

18. The method of claim 2, further comprising the steps of:
reserving an area for a preplaced object; and
comparing the ith removed object with the reserved area to prevent the ith removed object from overlapping the reserved area.

19. The method of claim 1 wherein each object profile has an aspect ratio, and the lowest cost for placing said first removed object is the lowest cost of placing said first removed object using each object profile.

20. A system for compacting of a set of objects, comprising:
   a logic processor;
   an object register connected to said logic processor for storing data related to said set of objects, each of said objects having a position attribute for determining its position within a defined two-dimensional area;
   an unrefined object register connected to said logic processor for storing a listing of a set of unrefined objects of said set of objects;
   an unrefined profile register connected to said logic processor for storing an unrefined profile of said set of unrefined objects;
   a refined object register connected to said logic processor for storing a listing of a set of refined objects of said set of objects;
   a refined profile register connected to said logic processor for storing a refined profile of said set of refined objects; and
   a cost optimizer operated on by said logic processor for selecting one of said unrefined objects stored in said unrefined object register, said cost optimizer determining a position attribute for said selected object by matching a curvature of said selected object with a curvature of said unrefined profile and by matching a curvature of said selected object with a curvature of said refined profile.

21. A system as recited in claim 20 further comprising:
   a net register connected to said logic processor for storing connection net information comprising a net type and an object net length for each of said objects, said cost optimizer determining a position attribute for said selected object by using said unrefined profile, said refined profile and said connection net information.

* * * * *